US010629600B2

(12) United States Patent
Kim et al.

(10) Patent No.: US 10,629,600 B2
(45) Date of Patent: Apr. 21, 2020

(54) INTEGRATED CIRCUIT DEVICE INCLUDING A SUPPORT PATTERN, A LOWER ELECTRODE PATTERN, A DIELECTRIC STRUCTURE, AND AN UPPER ELECTRODE STRUCTURE

(71) Applicant: Samsung Electronics Co., Ltd., Suwon-si, Gyeonggi-do (KR)

(72) Inventors: Hui-jung Kim, Seongnam-si (KR); Sung-hee Han, Hwaseong-si (KR); Ki-seok Lee, Hwaseong-si (KR); Bong-soo Kim, Yongin-si (KR); Yoo-sang Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 16/014,118

(22) Filed: Jun. 21, 2018

(65) Prior Publication Data
US 2019/0189617 A1    Jun. 20, 2019

(30) Foreign Application Priority Data
Dec. 15, 2017 (KR) .......................... 10-2017-0173154

(51) Int. Cl.
*H01L 27/108* (2006.01)
*H01L 49/02* (2006.01)

(52) U.S. Cl.
CPC .. *H01L 27/10817* (2013.01); *H01L 27/10852* (2013.01); *H01L 28/91* (2013.01); *H01L 27/10814* (2013.01)

(58) Field of Classification Search
CPC ......... H01L 27/10817; H01L 27/10852; H01L 28/90; H01L 28/91
See application file for complete search history.

(56) References Cited

U.S. PATENT DOCUMENTS

| 6,974,994 B1 | 12/2005 | Kuo et al. |
| 7,919,863 B2 | 4/2011 | Benson |
| 8,163,613 B2 | 4/2012 | Fishburn |
| (Continued) | | |

FOREIGN PATENT DOCUMENTS

| KR | 10-2004-0008698 A | 1/2004 |
| KR | 10-2005-0019500 A | 3/2005 |

*Primary Examiner* — Ermias T Woldegeorgis
(74) *Attorney, Agent, or Firm* — Harness, Dickey & Pierce, P.L.C.

(57) ABSTRACT

An integrated circuit device may include a support pattern over a substrate, a lower electrode pattern and a dielectric structure over the substrate, and an upper electrode structure on the dielectric structure. The support pattern may include a first support structure extending in a vertical direction. The lower electrode pattern may be between the support pattern and the dielectric structure. The lower electrode pattern may include a first group of N (e.g., an integer of 4 or more) lower electrodes that are spaced apart from each other and may extend in the vertical direction to a first level above the substrate. The dielectric structure may include a first dielectric protrusion that extends in the vertical direction and surrounds the first support structure and the first group of N lower electrodes. The upper electrode structure may include a first upper electrode protrusion that surrounds the first dielectric protrusion.

17 Claims, 26 Drawing Sheets

(56) References Cited

U.S. PATENT DOCUMENTS

| | | |
|---|---|---|
| 8,163,623 B2 | 4/2012 | Choi |
| 9,012,326 B2 | 4/2015 | Kim et al. |
| 9,324,609 B2 | 4/2016 | Kim et al. |
| 2008/0035976 A1 | 2/2008 | Kim |
| 2010/0009512 A1* | 1/2010 | Fishburn ........... H01L 27/10817 |
| | | 438/399 |
| 2017/0025604 A1 | 1/2017 | Sills et al. |
| 2017/0186560 A1 | 6/2017 | Hu et al. |

* cited by examiner

INTEGRATED CIRCUIT DEVICE INCLUDING A SUPPORT PATTERN, A LOWER ELECTRODE PATTERN, A DIELECTRIC STRUCTURE, AND AN UPPER ELECTRODE STRUCTURE

CROSS-REFERENCE TO RELATED APPLICATION

This application claims the benefit of Korean Patent Application No. 10-2017-0173154, filed on Dec. 15, 2017, in the Korean Intellectual Property Office, the disclosure of which is incorporated herein in its entirety by reference.

BACKGROUND

Inventive concepts relate to an integrated circuit device and/or a method of manufacturing the same, and more particularly, to an integrated circuit device including a capacitor structure and/or a method of manufacturing the integrated circuit device.

Since an area allocated to a cell has decreased with downscaling of integrated circuit devices, the width of a capacitor structure has decreased and the height thereof has increased to maintain an effective surface area of the capacitor structure. However, as the aspect ratio of the capacitor structure increases, difficulty of a manufacturing process has also increased. Therefore, there is a need to develop an integrated circuit device having a structure in which the height of a capacitor structure is reduced/or which manufacturing process difficulties are reduced.

SUMMARY

Inventive concepts provide an integrated circuit device for decreasing the height thereof and/or reducing the difficulty of a manufacturing process.

According to an aspect of inventive concepts, an integrated circuit device may include a plurality of support columns arranged on a substrate, first through fourth lower electrodes, a dielectric layer, and an upper electrode. The plurality of support columns may be spaced apart from each other in a first direction parallel with a top surface of the substrate and a second direction parallel with the top surface of the substrate. The second direction may be different from the first direction. The plurality of support columns may extend in a third direction perpendicular to the top surface of the substrate. The first through fourth lower electrodes may be positioned on side walls of each of the plurality of support columns so as to be spaced apart from one another. The first through fourth lower electrodes may extend in the third direction. The first through fourth lower electrodes may include a first lower electrode, a second lower electrode, a third lower electrode, and a fourth lower electrode. The dielectric layer may surround the plurality of support columns and the first through fourth lower electrodes. The upper electrode may surround the plurality of support columns and the first through fourth lower electrodes. The dielectric layer may be between the upper electrode and the plurality of support columns and the first through fourth lower electrodes. Each of the first through fourth lower electrodes may include at least two first side surfaces contacting corresponding side walls among the side walls of each of the plurality of support columns.

According to another aspect of inventive concepts, an integrated circuit device may include a plurality of support columns arranged on a substrate, first through fourth lower electrodes, a dielectric layer, and an upper electrode. The plurality of support columns may be arranged on the substrate and spaced apart from each other in a first direction parallel with a top surface of the substrate and a second direction parallel with the top surface of the substrate. The second direction may be different from the first direction. The plurality of support columns may extend in a third direction perpendicular to the top surface of the substrate. The first through fourth lower electrodes may be positioned on side walls of each of the plurality of support columns so as to be spaced apart from one another. The first through fourth lower electrodes may extend in the third direction. The first through fourth lower electrodes may include a first lower electrode, a second lower electrode, a third lower electrode, and a fourth lower electrode. The dielectric layer may surround the plurality of support columns and the first through fourth lower electrodes. The upper electrode may surround the plurality of support columns and the first through fourth lower electrodes with the dielectric layer between the upper electrode and the plurality of support columns and the first through fourth lower electrodes. Each of the first through fourth lower electrodes may include two first side surfaces and two second side surfaces. The two first side surfaces may be positioned on corresponding side walls among the side walls of each of the plurality of support columns. The two second side surfaces may contact the dielectric layer. The upper electrode may surround the two second side surfaces.

According to yet another aspect of inventive concepts, an integrated circuit device may include a plurality of support columns arranged on a substrate, first through fourth lower electrodes, a dielectric layer, and an upper electrode. The plurality of support columns may be arranged on the substrate and may be spaced apart from each other in a first direction parallel with a top surface of the substrate and a second direction parallel with the top surface of the substrate. The second direction may be different from the first direction. The plurality of support columns may extend in a third direction perpendicular to the top surface of the substrate. The first through fourth lower electrodes may be positioned on side walls of each of the plurality of support columns so as to be spaced apart from one another. The first through fourth lower electrodes may extend in the third direction, and each of the first through fourth lower electrodes may include at least two first side surfaces contacting corresponding side walls among the side walls of each of the plurality of support columns. The dielectric layer may surround the plurality of support columns and the first through fourth lower electrodes. The upper electrode may surround the plurality of support columns and the first through fourth lower electrodes with the dielectric layer between the upper electrode and the plurality of support columns and the first through fourth lower electrodes. The upper electrode may have a grid-shaped cross-section including a plurality of lattices arranged in the first and second directions at the same level as a top surface of the first lower electrode. The first through fourth lower electrodes may include a first lower electrode, a second lower electrode, a third lower electrode, and a fourth lower electrode.

According to a further aspect of inventive concepts, a method of manufacturing an integrated circuit device may include forming a plurality of support columns on a substrate so as to be arranged in a first direction and a second direction, forming first through fourth lower electrodes on side walls of each of the plurality of support columns so as to be spaced apart from one another, forming a dielectric layer surrounding the plurality of support columns and the first through fourth lower electrodes, and forming an upper electrode on the dielectric layer so as to surround the plurality of support columns and the first through fourth lower electrodes. The first and second directions may be parallel with a top surface of the substrate. The first through fourth lower electrodes may include a first lower electrode, a second lower electrode, a third lower electrode, and a fourth lower electrode. Each of the first through fourth lower electrodes may include two first side surfaces contacting corresponding side walls among the side walls of each of the plurality of support columns.

According to another aspect of inventive concepts, an integrated circuit device may include a substrate, a support pattern over the substrate, a lower electrode pattern and a dielectric structure over the substrate, and an upper electrode structure on the dielectric structure. The support pattern may include a first support structure extending in a vertical direction that is perpendicular to a top surface of the substrate. The lower electrode pattern may be over the substrate between the support pattern and the dielectric structure. The lower electrode pattern may include a first group of N lower electrodes that are spaced apart from each other. The first group of N lower electrodes may extend in the vertical direction to a first level above the top surface of the substrate. N may be an integer greater than or equal to 4. The dielectric structure may include a first dielectric protrusion that surrounds the first support structure and the first group of N lower electrodes. The first dielectric protrusion may extend in the vertical direction. The upper electrode structure may include a first upper electrode protrusion that surrounds the first dielectric protrusion.

According to another aspect of inventive concepts, an integrated circuit device may include a substrate, a support pattern over the substrate, a lower electrode pattern and a dielectric structure over the substrate, and an upper electrode structure over the dielectric structure. The support pattern may include a first support structure extending in a vertical direction that is perpendicular to a top surface of the substrate. A horizontal cross-section of the support pattern may have a cross-shape when viewed from a plan view. The lower electrode pattern may be over the substrate between the support pattern and the dielectric structure. The lower electrode pattern may include a first group of lower electrodes that extend in the vertical direction to a first level above the substrate. The first group of lower electrodes may include a first lower electrode, a second lower electrode, a third lower electrode, and a fourth lower electrode that are spaced apart from each other along an outer surface of the first support structure. The first lower electrode, the second lower electrode, the third lower electrode, and the fourth lower electrode may be separated from each other by the first support structure. The dielectric structure may include a first dielectric protrusion that surrounds the first support structure and the first group of lower electrodes. The first dielectric protrusion may extend in the vertical direction. The upper electrode structure may include a first upper electrode protrusion that surrounds the first dielectric protrusion.

According to yet another aspect of inventive concepts, an integrated circuit device may include a substrate, a support pattern on the substrate, a lower electrode pattern and a dielectric structure over the substrate, and an upper electrode structure on the dielectric structure. The support pattern may include a first support structure extending in a vertical direction that is perpendicular to a top surface of the substrate. A horizontal cross-section of the first support structure may have a rectangular shape with rounded corners or a square shape with rounded corners when viewed from a plan view. The lower electrode pattern may be between the support pattern and the dielectric structure. The lower electrode pattern may include a first group of lower electrodes that extend in the vertical direction to a first level above the substrate. The first group of lower electrodes may include a first lower electrode, a second lower electrode, a third lower electrode, and a fourth lower electrode that are spaced apart from each other along an outer surface of the first support structure. The dielectric structure may include a first dielectric protrusion that surrounds the first support structure and extends in the vertical direction. The upper electrode structure may include a first upper electrode protrusion that surrounds the first dielectric protrusion.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
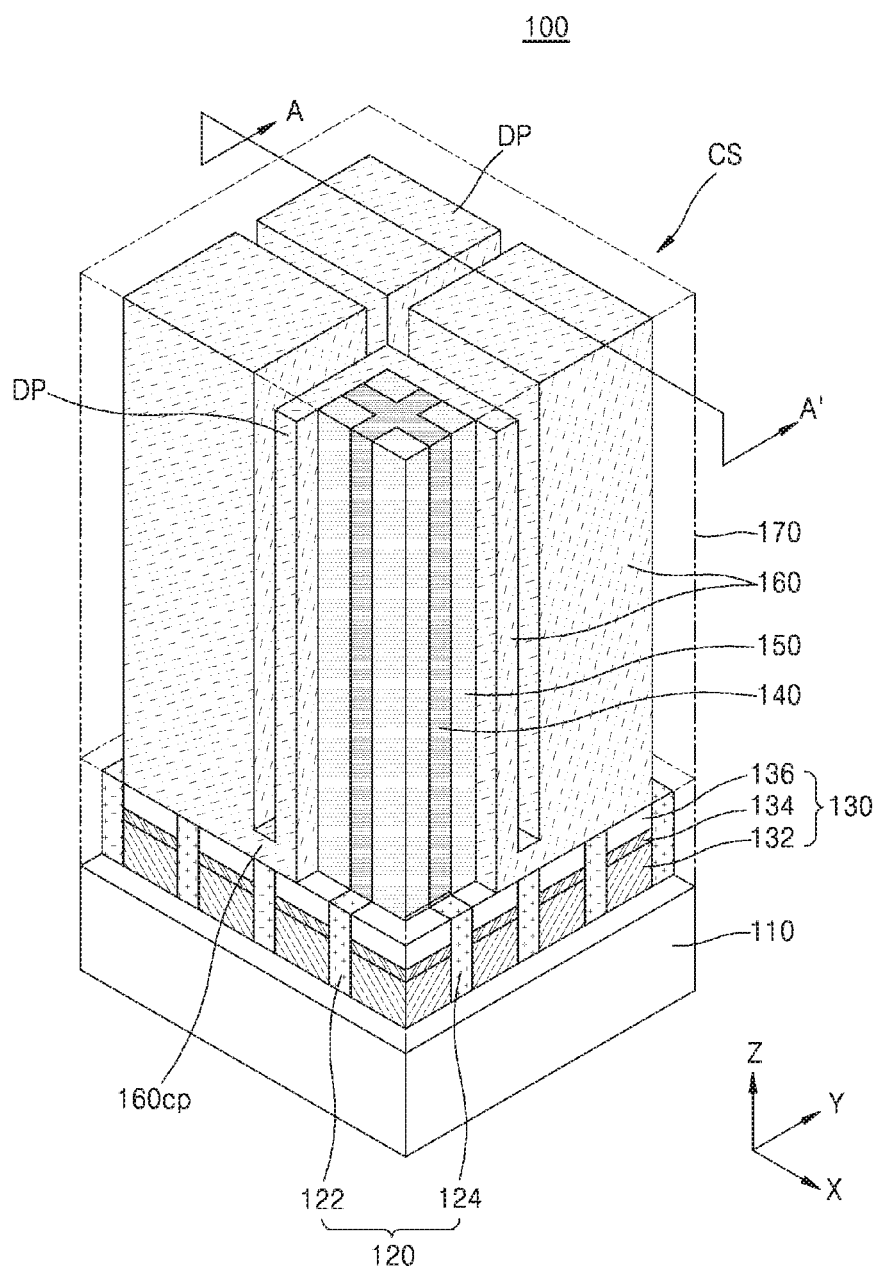
FIG. 1 is a perspective view of an integrated circuit device according to some example embodiments.
Figure 2:
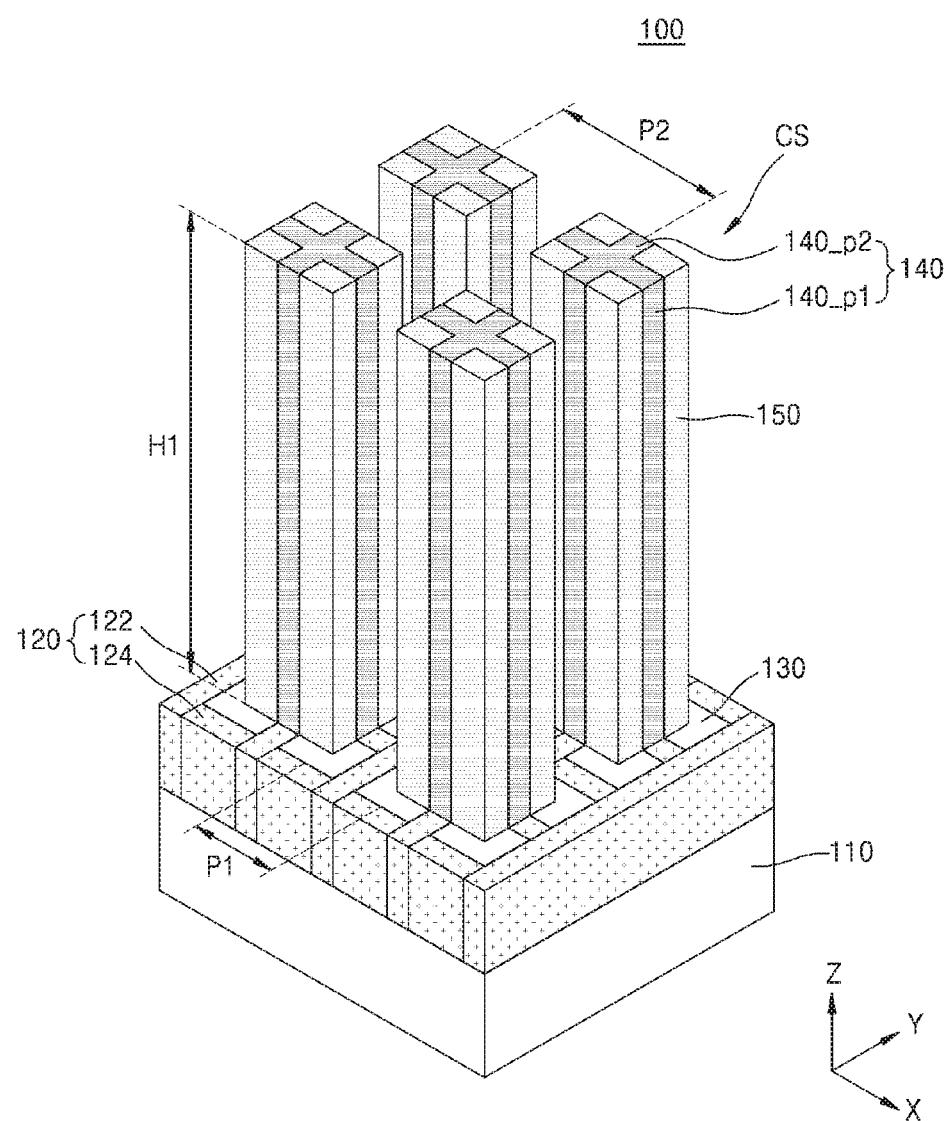
FIG. 2 is a perspective view of the integrated circuit device illustrated in FIG. 1, excluding an upper electrode and a dielectric layer.
Figure 3:
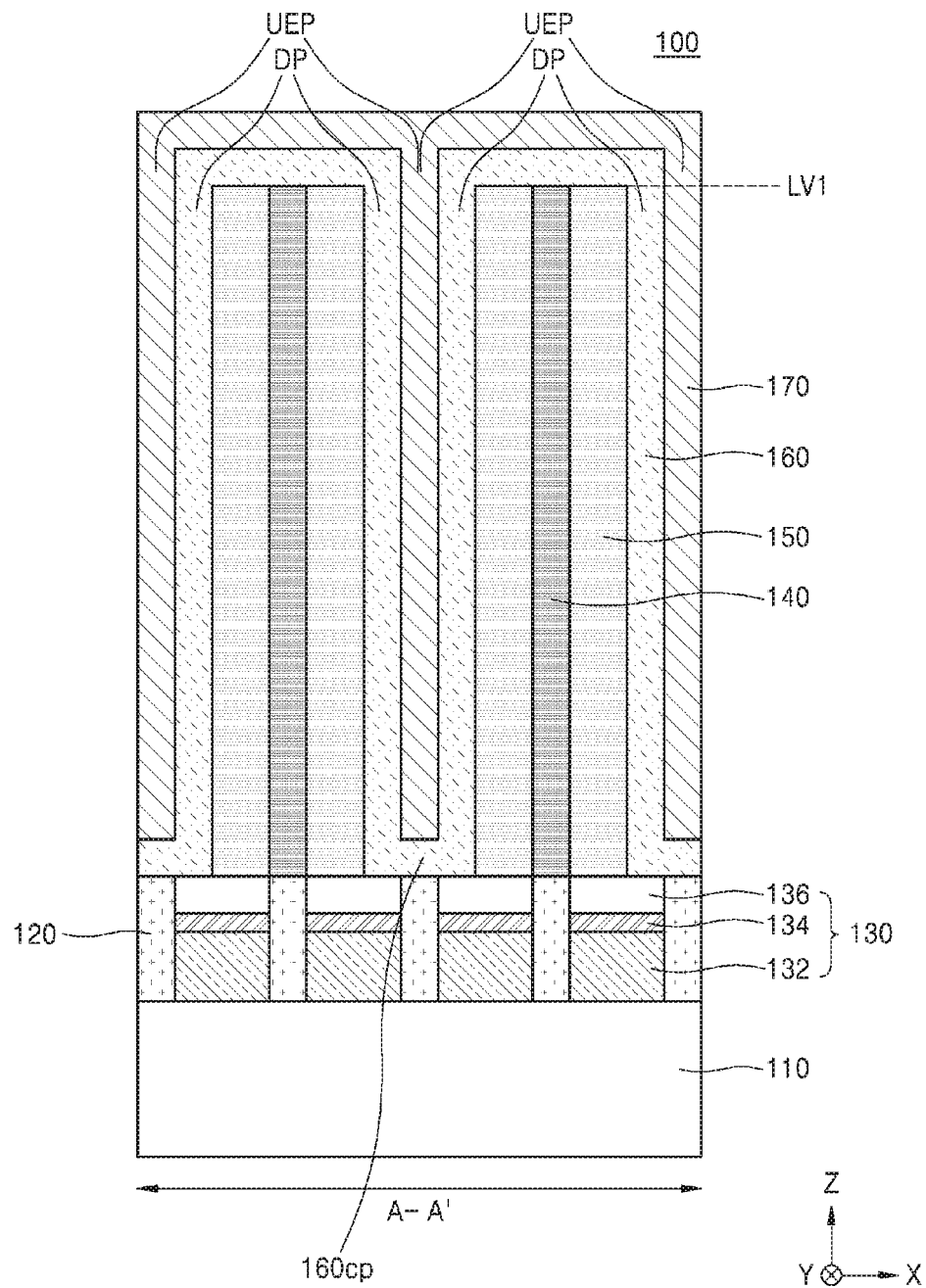
FIG. 3 is a cross-sectional view of the integrated circuit device, taken along line A-A' in FIG. 1.
Figure 4:
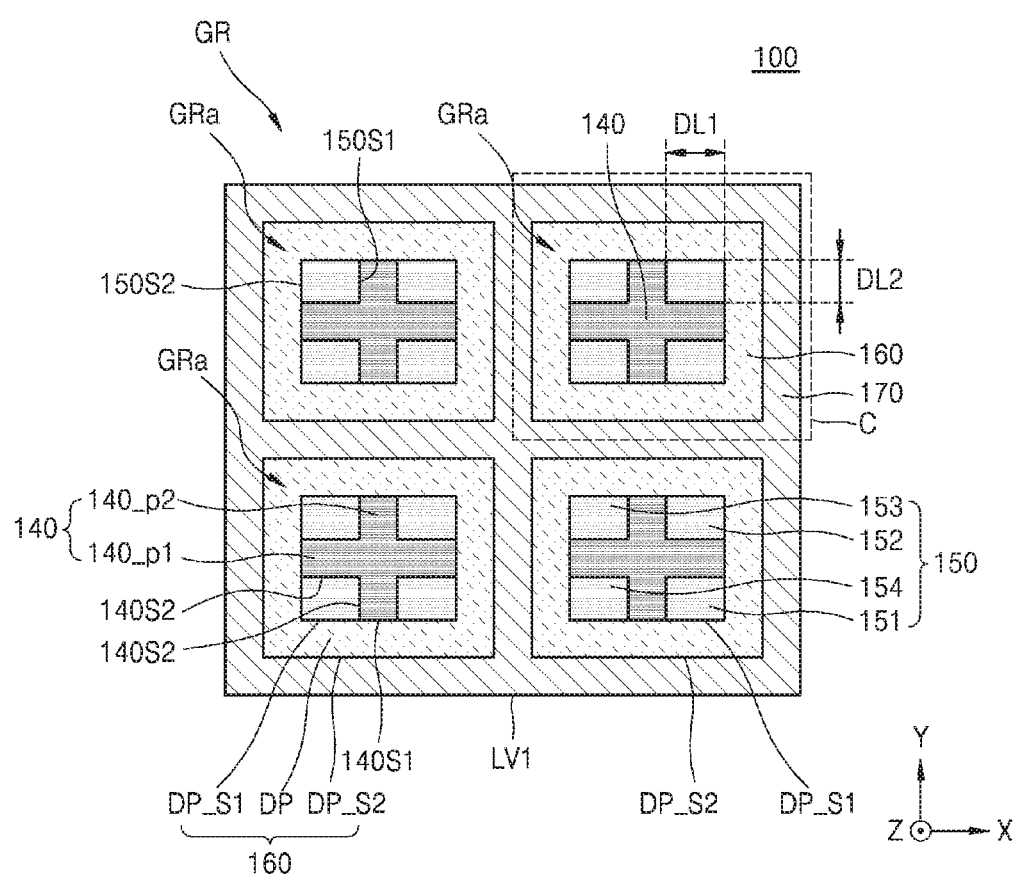
FIG. 4 is a horizontal cross-sectional view of the integrated circuit device, taken at a first level LV1 in FIG. 3.

FIG. 1 is a perspective view of an integrated circuit device 100 according to some example embodiments. FIG. 2 is a perspective view of the integrated circuit device 100 illustrated in FIG. 1, excluding an upper electrode 170 and a dielectric layer 160. FIG. 3 is a cross-sectional view of the integrated circuit device 100, taken along line A-A' in FIG. 1. FIG. 4 is a horizontal cross-sectional view of the integrated circuit device 100, taken at a first level LV1 in FIG. 3.

Referring to FIG. 1 through 4, the integrated circuit device 100 may include a contact structure 130 on a substrate 110 and a capacitor structure CS on the contact structure 130. The capacitor structure CS may include a lower electrode 150, the dielectric layer 160, and the upper electrode 170.

In some example embodiments, the substrate 110 may include a Group IV semiconductor such as Si or Ge, a Group IV-IV compound semiconductor such as SiGe or SiC, or a Group III-V compound semiconductor such as GaAs, InAs, or InP. The substrate 110 may include a conductive region, e.g., an impurity-doped well or an impurity doped structure.

An insulating structure 120 may be positioned on the substrate 110. The insulating structure 120 may include a plurality of insulating capping lines 122 extending in one direction (e.g., a Y direction) parallel with the top surface of the substrate 110 and a plurality of insulating fences 124 positioned in a line in the Y direction between two adjacent insulating capping lines 122 among the insulating capping lines 122. In some example embodiments, the insulating capping lines 122 and the insulating fences 124 may include silicon nitride.

A contact pattern including a contact structures 130 may be between a top surface of the substrate 110 and a lower electrode pattern including the lower electrodes 150. A plurality of contact structures 130 may be positioned in a line in the Y direction between two adjacent insulating capping lines 122. Each of the contact structures 130 may be positioned between two adjacent insulating fences 124 in the Y direction. For example, each contact structure 130 may fill a space defined by two adjacent insulating capping lines 122 and two adjacent insulating fences 124.

Each contact structure 130 may include a lower conductive plug 132, a metal silicide layer 134, and an upper conductive plug 136, which are sequentially formed on the substrate 110. The lower conductive plug 132 may include doped polysilicon. The metal silicide layer 134 may include cobalt silicide, titanium silicide, nickel silicide, or manganese silicide. The upper conductive plug 136 may include a metal, metal nitride, or a combination thereof. For example, the upper conductive plug 136 may include at least one selected from among Ti, TiN, Ru, Ta, TaN, WN, Pt, and Ir.

As shown in FIG. 2, a plurality of the contact structures 130 may be spaced apart on the substrate 110 in X and Y directions. The insulating structure 120 having a grid shape may be positioned to surround the sides of the contact structures 130. The contact structures 130 may be arranged at a first pitch P1 in the X direction, where the first pitch P1 may be a distance between the centers of two adjacent contact structures 130 in the X direction.

A support pattern including a plurality of support columns 140 may be arranged on the insulating structure 120 and the contact structures 130 to be spaced apart in the X and Y directions. The support columns 140 may extend in one direction (e.g., a Z direction), such as a vertical direction perpendicular to the top surface of the substrate 110. The support columns 140 may also be referred to as support structures. A set (e.g., group) of lower electrodes 150 may be arranged at side walls of each of the support columns 140. The set of the lower electrodes 150 may include N lower electrodes that may be spaced apart from each other and may be separated by each other by a corresponding one of the support columns 140. For example, N may be an integer greater than or equal to 4. The set of lower electrodes 150 may include first through fourth lower electrodes 151, 152, 153, and 154 which are arranged on the side walls of each support column 140 to be spaced apart and extend in the Z direction. The set of the lower electrodes 150 may extend in the Z direction to a first level LV1 above the top surface of the substrate 110. A horizontal cross-sectional of the lower electrodes 150 may have a polygonal shape, such as a quadrilateral shape (e.g., square or rectangular) when viewed in a plan view at the first level LV1. The lower electrodes 150 may be between the support columns 140 and the dielectric layer 160.

A set (e.g., group) of the contact structures 130 may be between the top surface of the substrate 110 and a set of the lower electrodes 150. Each contact structure 130 in the set of contact structures 130 (e.g., 4 contact structures) may be electrically connected to a corresponding lower electrode 150 of a set of lower electrodes 150. Each contact structure 130 may connect to a different cell transistor in the substrate 110.

In some example embodiments, the support columns 140 may be arranged at a second pitch P2 in the X direction. The second pitch P2 may be about double the first pitch P1. For example, the center of one of the support columns 140 may be separated from the center of an adjacent support column 140 by the second pitch P2, e.g., the double of the first pitch P1, in the X direction. Accordingly, each of the support columns 140 may overlap one of two adjacent insulating capping lines 122 and may not overlap the other of two adjacent insulating capping lines 122. Each support column 140 may overlap one of two adjacent insulating fences 124 arranged in the Y direction and may not overlap the other of two adjacent insulating capping lines 122.

As shown in FIGS. 2 and 4, the support column 140 may include a first part 140_p1 that extends in the X direction between two of the lower electrodes 150. The support column 140 may include a second part 140_p2 that extends in the Y direction between two of the lower electrodes 150. An outer surface of the first part of the support column 140_p1 and an outer surface of the second part of the support column 140_p2 may contact an inner surface DP_S1 of a corresponding one of the dielectric protrusions DP. The first part of the support column 140_p1 may be coplanar in the X direction with two of the lower electrodes 150 that are spaced apart from each other in the Y direction. The second part of the support column 140_p2 may be coplanar in the Y direction with the two of the lower electrodes 150 that are spaced apart from each other in the X direction. In a plan view, an inner surface of the upper electrode 170 may contact an outer surface DP_S2 of the dielectric protrusion DP.

As shown in FIGS. 2 and 4, the support columns 140 may have a cross-shaped cross-section when viewed from a plan view over the substrate 110. The support columns 140 may extend perpendicular to the Z direction. For example, each of the support columns 140 may have four protruding side walls 140S1. Two of the four protruding side walls 140S1 may be parallel with the X direction and the other two protruding side walls 140S1 may be parallel with the Y direction. Each support column 140 may have a pair of recessed side walls 140S2 between two adjacent protruding side walls 140S1. In other words, the support column 140 may have four pairs of recessed side walls 140S2 sequentially arranged rotating around the Z direction by 90 degrees. The pair of the recessed side walls 140S2 may be respectively recessed inward from the two adjacent protruding side walls 140S1 and may extend in the Z direction. The pair of the recessed side walls 140S2 may be perpendicular to each other, but inventive concepts is not limited thereto. The pair of the recessed side walls 140S2 may have an angle greater than 90 degrees with respect to each other.

In some embodiments, the support columns 140 may directly contact the dielectric layer 160. For example, as shown in FIG. 4, the protruding side walls 140S1 of the support column 140 may directly contact an inner surface of the dielectric layer 160, such as an inner surface DP_S1 of one of the plurality of dielectric protrusions DP.

The first through fourth lower electrodes 151, 152, 153, and 154 may extend in the Z direction to have a first height H1 and each may have a bar-shaped or rectangular horizontal cross-section. The first height H1 may be about 50 nm to about 3 μm, but is not limited thereto.

Each of the first through fourth lower electrodes 151, 152, 153, and 154 may have two first side surfaces 150S1 (see FIG. 4) contacting a corresponding one of the support columns 140. The two first side surfaces 150S1 may be in contact with a pair of the recessed side walls 140S2.

The bottom surface of the set of the lower electrodes 150 may be in contact with the top surfaces of a plurality of contact structures 130 and may be at the same level as the bottom surfaces of the support columns 140. The top surface of the set of the lower electrodes 150 may be at the same level as the top surfaces of the support columns 140. For example, the top surface of the first lower electrode 151 may be at a first level LV1 and the top surface of each of the support columns 140 may also be at the first level LV1. In other words, first side surfaces 150S1 of the set of the lower electrodes 150 may be in contact with side walls of each support column 140 over the entire height of the set of the lower electrodes 150.

Since the first side surfaces 150S1 of the set of the lower electrodes 150 are in contact with side walls of each support column 140 over the entire height of the set of the lower electrodes 150, the set of the lower electrodes 150 may be limited and/or prevented from tilting or collapsing during an etching process even though the set of the lower electrodes 150 has a high aspect ratio.

In some example embodiments, the support columns 140 may include silicon oxide, silicon oxynitride, or silicon oxycarbide. In some example embodiments, the lower electrode set 150 may include at least one of a metal, a metal nitride, or a conductive metal oxide. In some example embodiments, the lower electrode set 150 may include at least one selected from among Ti, TiN, Ru, Ta, TaN, WN, Pt, and Ir. In other embodiments, the set of the lower electrodes 150 may include conductive metal oxide such as iridium oxide.

The dielectric layer 160 may include a dielectric structure that includes a plurality of dielectric protrusions DP connected to each other through connecting portions 160cp. For example, as shown in FIG. 1, each one of the dielectric protrusions DP in the dielectric layer 160 may surround a corresponding one of the support columns 140 and a corresponding one of the lower electrodes 150. The dielectric protrusions DP may extend in the Z direction. The dielectric protrusions DP may be spaced apart from each other. The dielectric layer 160 may include connecting portions 160cp for connecting the dielectric protrusions DP to each other. Portions of the upper electrode 170 may extend in the Z direction in a space between the dielectric protrusions DP over the connecting portions 160cp.

The dielectric layer 160 may surround the top surface and protruding side walls 140S1 of each of the support columns 140 and the top surface and side walls of the set of the lower electrodes 150. The dielectric layer 160 may include at least one of a metal oxide (e.g., at least one of $HfO_2$, $ZrO_2$, $Al_2O_3$, $La_2O_3$, $Ta_2O_3$, or $TiO_2$) or a perovskite-structured dielectric material (e.g., at least one of $SrTiO_3$(STO), (Ba, Sr)$TiO_3$ (BST), $BaTiO_3$, Pb(Zr,Ti)$O_3$(PZT) or (Pb,La)(Zr,Ti)$O_3$ (PLZT)). The dielectric layer 160 may include a single layer or a combination of a plurality of layers. In some example embodiments, the dielectric layer 160 may have a thickness of about 2 nm to about 20 nm but is not limited thereto.

The upper electrode 170 may surround each support column 140 and the set of the lower electrodes 150 with the dielectric layer 160 therebetween. In some example embodiments, the upper electrode 170 at least one of a metal, a metal nitride, or a conductive metal oxide. The upper electrode 170 may include at least one selected from among Ti, TiN, Ru, Ta, TaN, WN, Pt, and Ir. In other embodiments, the upper electrode 170 may include conductive metal oxide such as iridium oxide. As shown in FIG. 3, the portion of the upper electrode 170 that surrounds the dielectric protrusion DP may be referred to as an upper electrode protrusion UEP. The upper electrode 170 may include a plurality of upper electrode protrusions UEP that surround corresponding ones of the plurality of dielectric protrusions DP.

As shown in FIG. 4, each lower electrode 150 in the set of the lower electrodes 150 may have two first side surfaces 150S1 and two second side surfaces 150S2. The two first side surfaces 150S1 may be in contact with the support column 140 and the two second side surfaces 150S2 may be in contact with the dielectric layer 160. The upper electrode 170 may face the two second side surfaces 150S2 with the dielectric layer 160 therebetween. Accordingly, an area of the two second side surfaces 150S2 may correspond to an effective surface area for a cell with the capacitor structure CS. One of the two second side surfaces 150S2 may have a first width DL1 in the X direction and the other may have a second width DL2 in the Y direction. Accordingly, the effective surface area of a cell with the capacitor structure CS including one lower electrode 150 may be (DL1+DL2)× H1.

The lower electrodes 150 may be arranged between an inner surface DP_S1 of one of the plurality of dielectric protrusions DP and an outer surface (e.g., 140S2) of one of the plurality of support columns 140 that are adjacent to each other.

A cross-section of the upper electrode 170 at the first level LV1 may have a shape of a grid GR. For example, the grid GR may include a plurality of lattices GRa arranged in the X and Y directions. One support column 140 and the set of the lower electrodes 150 (e.g., the first through fourth lower electrodes 151, 152, 153, and 154) may be positioned in each of the lattices GRa. In addition, the dielectric layer 160 surrounding one support column 140 and the set of the lower electrodes 150 may be positioned in each lattice GRa.

In a comparison example, a plurality of lower electrodes (not shown) having a bar shape are arranged spaced apart in the X direction in a capacitor structure (not shown), and therefore, the capacitor structure is asymmetric with respect to X and Y axes. Among four side surfaces of each lower electrode, two side surfaces parallel to the Y direction may face adjacent lower electrodes respectively positioned at opposite sides with a dielectric layer (not shown) therebetween. In this case, undesirable coupling capacitance may occur due to two adjacent lower electrodes and a portion of the dielectric layer disposed therebetween.

Contrarily, according to some example embodiments, among four side surfaces of one lower electrode 150, the two second side surfaces 150S2 may face the upper electrode 170 with the dielectric layer 160 therebetween and the two first side surfaces 150S1 may respectively face adjacent lower electrodes 150 with a support column 140 therebetween. Accordingly, undesirable coupling capacitance occurring due to two adjacent lower electrodes 150 and the dielectric layer 160 therebetween may be decreased.

In another comparison example, a plurality of lower electrodes (not shown) having a bar shape are arranged spaced apart in the X direction in a capacitor structure (not shown), and therefore, the capacitor structure is asymmetric with respect to X and Y axes. Three side surfaces of each lower electrode may be in contact with a side surface of one of a plurality of support members having a bar shape and only one side surface of the lower electrode parallel with the X direction may face an upper electrode (not shown) with a dielectric layer (not shown) therebetween. In this case, an effective surface area of the capacitor structure may correspond to one side surface of the lower electrode.

Contrarily, according to some example embodiments, since the two second side surfaces 150S2 of one lower electrode 150 may face the upper electrode 170 with the dielectric layer 160 therebetween as described above, the effective surface area of a cell with the capacitor structure CS including one lower electrode 150 may correspond to the sum of the areas of the respective two second side surfaces 150S2 of one lower electrode 150. Consequently, even through the set of the lower electrodes 150 has the first height H1 which is relatively small, a desired capacitance for a cell with the capacitor structure CS may be obtained.

In general, as the first height H1 of each lower electrode 150 increases, the lower electrode 150 is more likely to tilt or collapse during an etching process for forming the lower electrode 150. In addition, as the first height H1 of the lower electrode 150 increases, it is difficult to precisely control the etching amount of the lower electrode 150, and therefore, a bottom portion of the lower electrode 150 may not be completely separated from a bottom portion of adjacent lower electrode 150.

However, according to some example embodiments described above, the first height H1 of each lower electrode 150 may be relatively small, and therefore, tilting of the lower electrode 150 or incomplete separation between adjacent lower electrodes 150 may be limited and/or prevented during a manufacturing process of lower electrodes 150.

According to some example embodiments, a support column structure 140P (see FIG. 19) including a plurality of first openings 140PH (see FIG. 19) arranged at the second pitch P2 may be formed first. A lower electrode layer 150L may be formed on a side wall of the support column structure 140P. Thereafter, the support column structure 140P and the lower electrode layer 150L may be sequentially etched to form each support column 140 and the set of lower electrodes 150 positioned at side walls of the support column 140 to be separated from each other. Accordingly, collapsing of the lower electrodes 150 may be limited and/or prevented during an etching process of the lower electrodes 150 and difficulty of the etching process of the lower electrodes 150 may be remarkably decreased.

Figure 5:
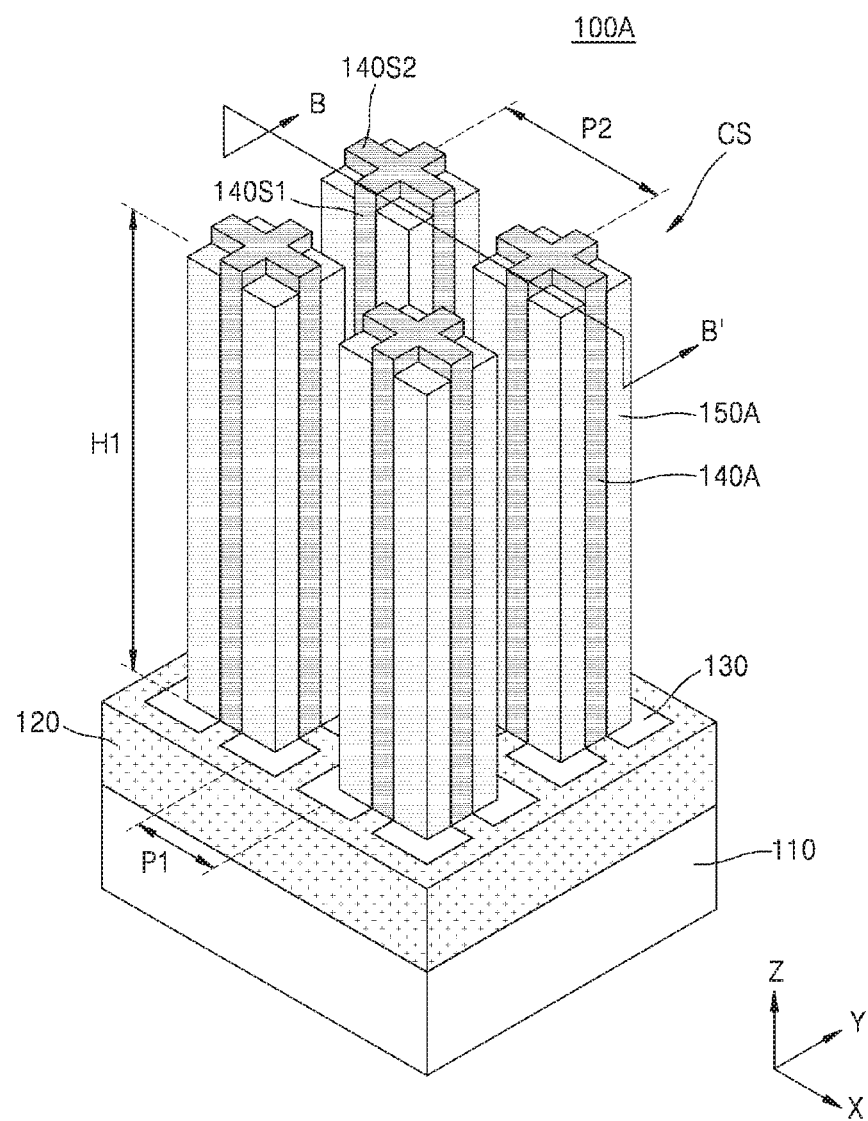
FIG. 5 is a perspective view of an integrated circuit device according to some example embodiments.
Figure 6:
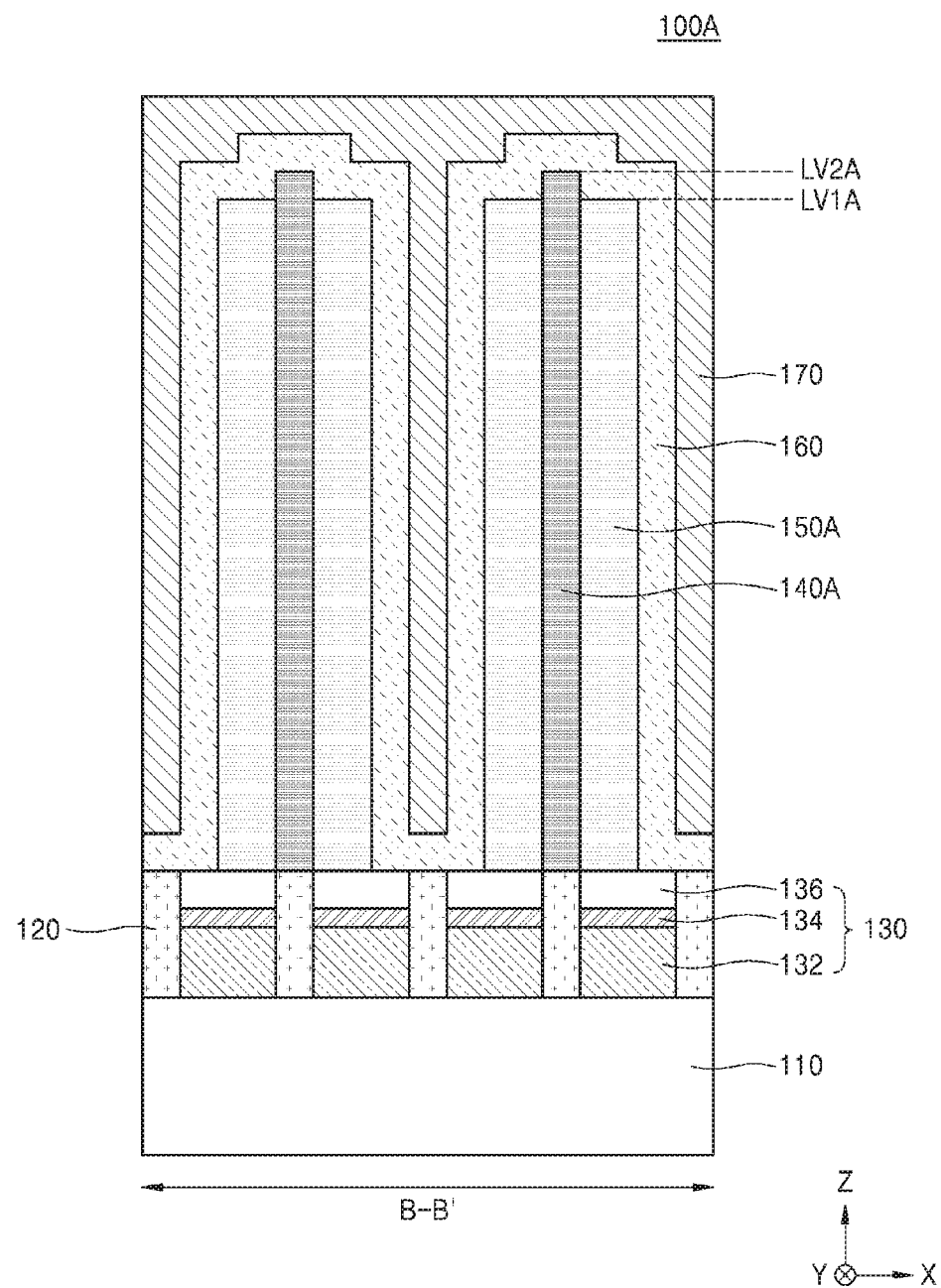
FIG. 6 is a cross-sectional view of the integrated circuit device of FIG. 5, taken along line B-B' in FIG. 5.

FIG. 5 is a perspective view of an integrated circuit device 100A according to some example embodiments. FIG. 6 is a cross-sectional view of the integrated circuit device 100A, taken along line B-B' in FIG. 5. In FIG. 5, the upper electrode 170 and the dielectric layer 160 included in the integrated circuit device 100A are omitted for ease of description. In FIGS. 1 through 6, like reference numerals denote like elements.

Referring to FIGS. 5 and 6, the support column 140 may extend in the Z direction from a second level of the support column 140 (e.g., a top surface level LV2A of the support column 140) above the substrate 110 towards the top surface of the substrate 110. The second level of the support column 140 (e.g., a top surface level LV2A of the support column 140) may be further above the top surface of the substrate 110 compared to a first level LV1A of the lower electrodes 150. The top surface level LV2A of a plurality of support columns 140A may be higher than the top surface level LV1A of a plurality of lower electrodes 150A. For example, an upper portion of each support column 140A may protrude above the top surface of a set of lower electrodes 150A. Accordingly, lower portions of a pair of recessed side walls 140S2 of the support column 140A may be in contact with each lower electrode 150A in the set of the lower electrodes 150A while upper portions of the pair of the recessed side walls 140S2 may not be covered by the lower electrode 150A but may be in contact with the dielectric layer 160.

Since the top surface of the support column 140A is higher than the top surface of the set of the lower electrodes 150A, the length of an electrical path between adjacent lower electrodes 150A in the set of the lower electrodes 150A through the dielectric layer 160 may increase. Accordingly, undesirable coupling capacitance that may occur between the lower electrodes 150A in the set through the dielectric layer 160 contacting the top surfaces of the lower electrode 150A may be decreased.

In addition, a capacitor's effective surface area between each lower electrode 150A and the upper electrode 170 may be increased, and therefore, the height of the lower electrode 150A may be decreased and difficulty of a process of forming the support column 140A and a process of etching the lower electrode 150A may also be decreased.

Figure 7:
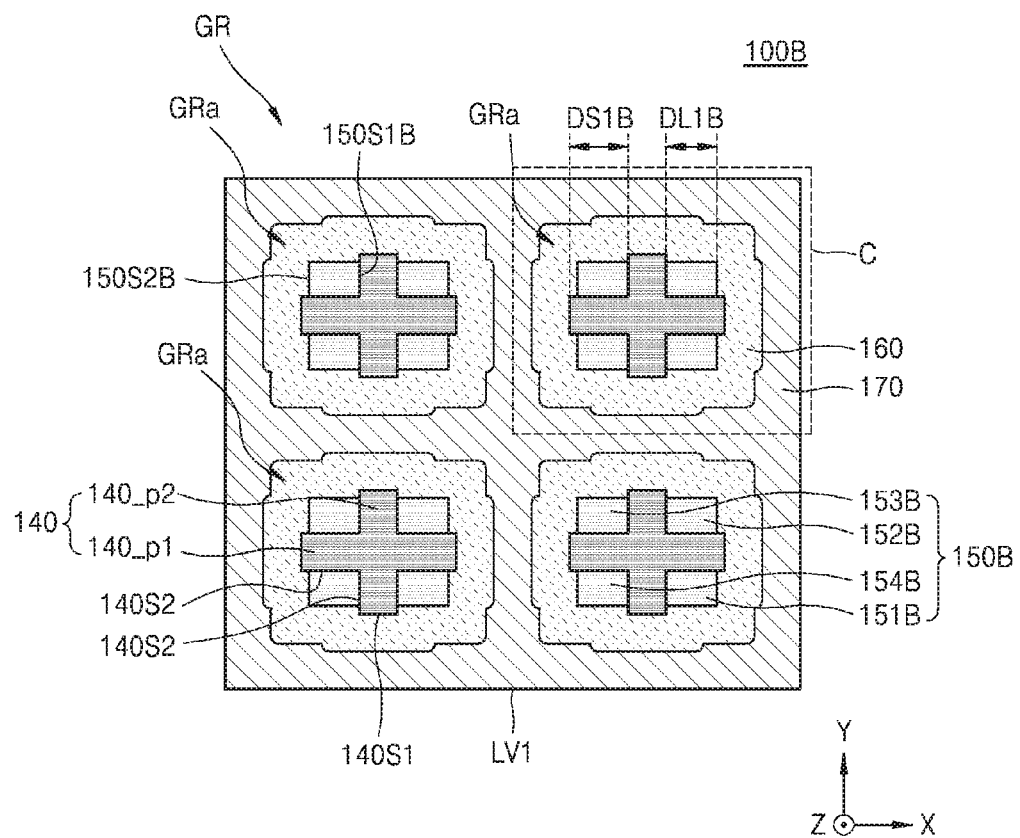
FIG. 7 is a cross-sectional view of an integrated circuit device according to some example embodiments.

FIG. 7 is a cross-sectional view of an integrated circuit device 100B according to some example embodiments. The cross-sectional view illustrated in FIG. 7 corresponds to a horizontal cross-sectional view taken at the first level LV1 in FIG. 3. In FIGS. 1 through 7, like reference numerals denote like elements.

Referring to FIG. 7, first side surfaces 150S1B of each lower electrode 150B in a set of lower electrodes 150B may respectively be in contact with a pair of the recessed side walls 140S2 of a corresponding one of a plurality of the support columns 140. A width DL1B of the first side surface 150S1B in the X direction may be less than a width DS1B of the recessed side wall 140S2 in the X direction. Accordingly, the four protruding side walls 140S1 of each support column 140 may protrude further out than second side surfaces 150S2B of the first through fourth lower electrodes 151B, 152B, 153B, and 154B, e.g., the lower electrodes 150B in the set. For example, the protruding side wall 140S1 between the first lower electrode 151 and the second lower electrode 152 may protrude outward from a center portion of the support column 140 with respect to the first and second lower electrodes 151B and 152B in the X direction, and therefore, a length of an electrical path between the first and second lower electrodes 151B and 152B through the dielectric layer 160 may increase.

As shown in FIG. 7, the first part of the support column 140_p1 may extend further in the X direction than two of the lower electrodes 150 that are spaced apart from each other in the Y direction such that the first part of the support column 140_p1 protrudes in the X direction from the lower electrodes 150 that are spaced apart from each other in the Y direction. The second part of the support column 140_p2 may extend further in the Y direction than two of the lower electrodes 150 that are spaced apart from each other in the X direction such that the second part of the support column 140_p2 protrudes in the Y direction from the two lower electrodes 150 that are spaced apart from each other in the X direction.

According to example embodiments described above, undesirable coupling capacitance, which may occur among the lower electrodes 150B in the set through the dielectric layer 160 contacting the second side surfaces 150S2B of the lower electrodes 150B, may be decreased. In addition, a capacitor's effective surface area between each lower electrode 150B and the upper electrode 170 may be increased, and therefore, the height of the lower electrode 150B may be decreased and difficulty of a process of forming the support column 140 and a process of etching the lower electrode 150B may also be decreased.

Figure 8:
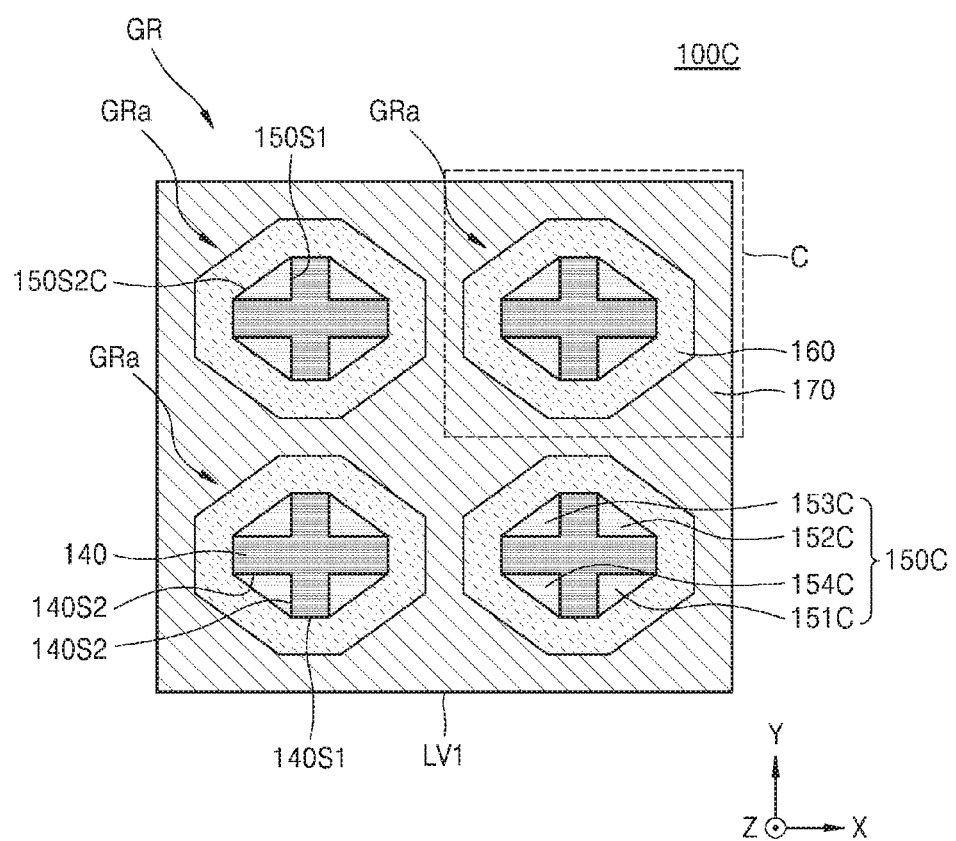
FIG. 8 is a cross-sectional view of an integrated circuit device according to some example embodiments.

FIG. 8 is a cross-sectional view of an integrated circuit device 100C according to some example embodiments. The cross-sectional view illustrated in FIG. 8 corresponds to a horizontal cross-sectional view taken at the first level LV1 in FIG. 3. In FIGS. 1 through 8, like reference numerals denote like elements.

Referring to FIG. 8, a set of lower electrodes 150C may include first to fourth electrodes 151C to 154C. Each of lower electrodes 150C may have a triangular cross-section, when viewed in a plan view at the first level LV1. For example, two first side surfaces 150S1 of the first lower electrode 151C may respectively be in contact with a pair of the recessed side walls 140S2 of each support column 140, and a diagonal side surface 150S2C of the first lower electrode 151C may be in contact with the dielectric layer 160.

Figure 9:
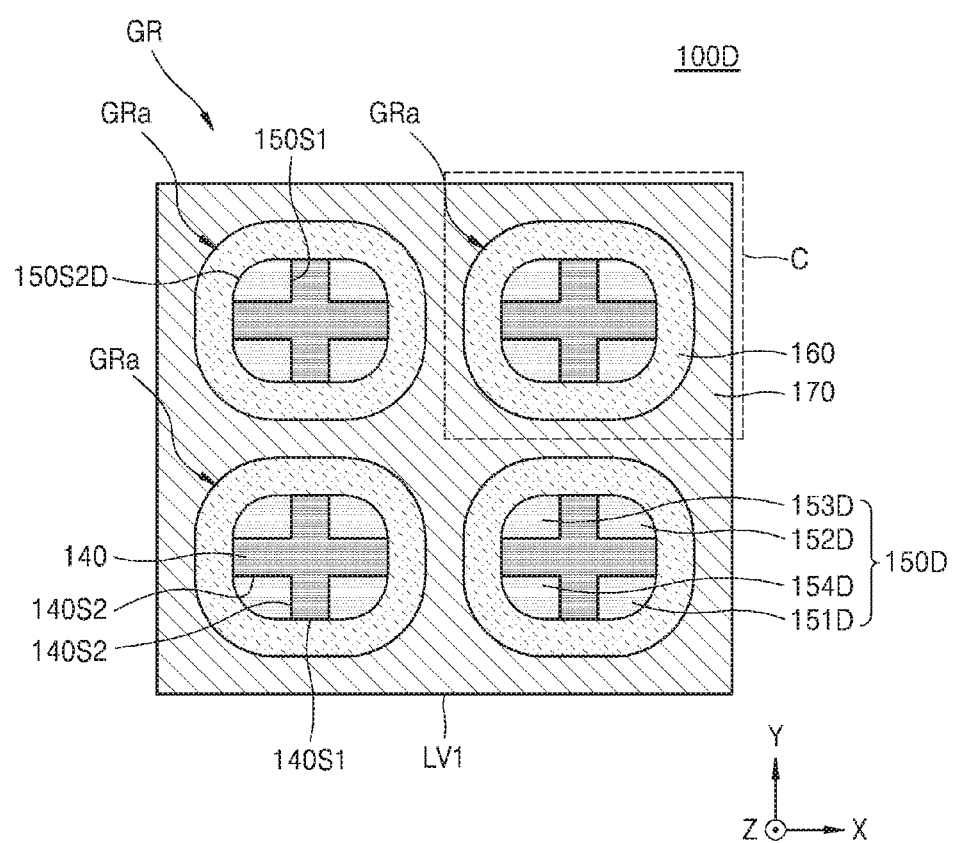
FIG. 9 is a cross-sectional view of an integrated circuit device according to some example embodiments.

FIG. 9 is a cross-sectional view of an integrated circuit device 100D according to some example embodiments. The cross-sectional view illustrated in FIG. 9 corresponds to a horizontal cross-sectional view taken at the first level LV1 in FIG. 3. In FIGS. 1 through 9, like reference numerals denote like elements.

Referring to FIG. 9, a set of lower electrodes 150D may include first to fourth electrodes 151D to 154D. Each of a set of lower electrodes 150D may have a side surface 150S2D including a curved surface contacting the dielectric layer 160. In other words, a horizontal cross-sectional of the lower electrodes 150 may have a curved shape when viewed in a plan view at the first level LV1.

In an example process of forming a plurality of the support columns 140 and a plurality of the lower electrodes 150D, the support column structure 140P (see FIG. 19) including a plurality of the first openings 140PH (see FIG. 19) arranged at the second pitch P2 may be formed first. The lower electrode layer 150L may be formed on a side wall of the support column structure 140P. Thereafter, the support column structure 140P and the lower electrode layer 150L may be etched to form each support column 140 and the set of lower electrodes 150D positioned at side walls of the support column 140 to be separated from each other. Each lower electrode 150D may have the side surface 150S2D, of which at least a portion includes a curved surface, according to the shape of a mask pattern 210M (see FIG. 21) used during the etching process of the support column structure 140P and the lower electrode layer 150L. Alternatively, each lower electrode 150D may have the side surface 150S2D, of which at least a portion includes a curved surface, by controlling etching conditions for the lower electrode layer 150L during the etching process of the support column structure 140P and the lower electrode layer 150L.

Figure 10:
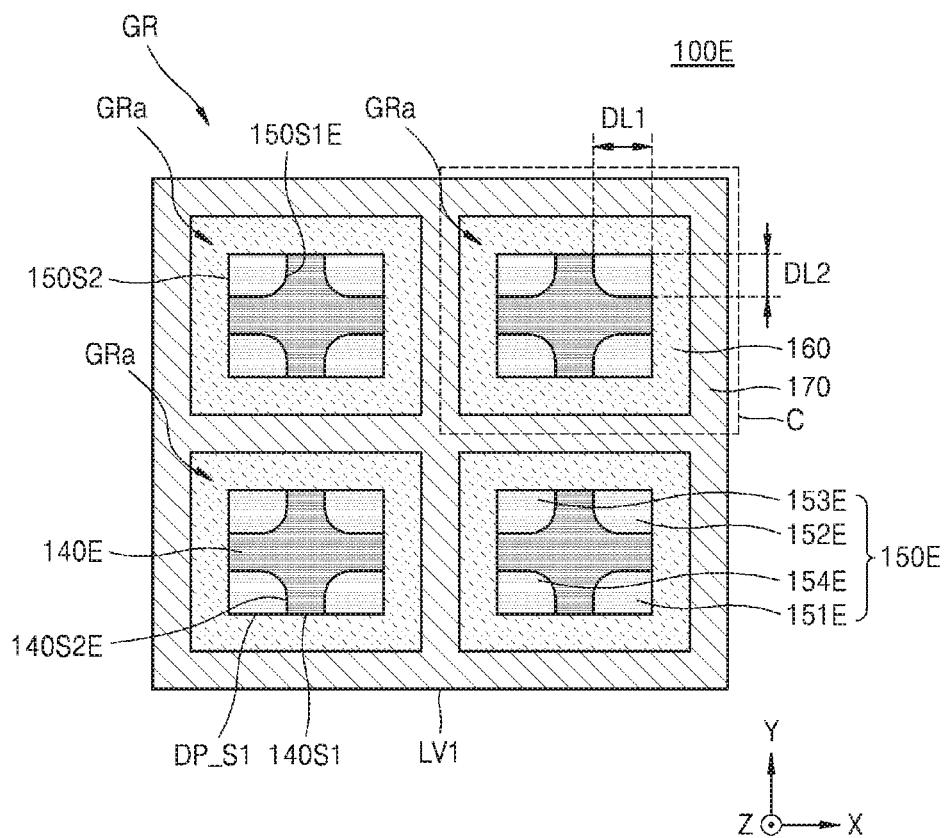
FIG. 10 is a cross-sectional view of an integrated circuit device according to some example embodiments.

FIG. 10 is a cross-sectional view of an integrated circuit device 100E according to some example embodiments. The cross-sectional view illustrated in FIG. 10 corresponds to a horizontal cross-sectional view taken at the first level LV1 in FIG. 3. In FIGS. 1 through 10, like reference numerals denote like elements.

Referring to FIG. 10, a set of lower electrodes 150E may include first to fourth electrodes 151E to 154E. Each of a plurality of support columns 140E may have four protruding side walls 140S1 and four recessed side walls 140S2E between the four protruding side walls 140S1. At least a portion of each of the recessed side walls 140S2E may include a curved surface. In addition, first side surfaces 150S1E of respective lower electrodes 150E in the set may respectively be in contact with the recessed side walls 140S2E of each support column 140E. At least a portion of each of the first side surfaces 150S1E may include a curved surface. In other words, a horizontal cross-sectional of the lower electrodes 150E may have a curved shape when viewed in a plan view at the first level LV1. The lower electrodes 150E may be between a concave surface of the recessed sidewalls 140S2E of the support column 140E and an inner surface DP_S1 of a dielectric protrusion in the dielectric layer 160. The first lower electrode 151E, second lower electrode 152E, third lower electrode 153E, and fourth lower electrode 154E may each contact a concave surface of the recessed sidewalls 140S2E of the support column 140E.

In an example process of forming a plurality of the support columns 140E, the support column structure 140P (see FIG. 19) including a plurality of the first openings 140PH (see FIG. 19) arranged at the second pitch P2 may be formed first. The lower electrode layer 150L may be formed on a side wall of the support column structure 140P. Thereafter, the support column structure 140P and the lower electrode layer 150L may be etched to form each support column 140E and a set of the lower electrodes 150E positioned at side walls of the support column 140E to be separated from each other. The support column 140E may have the recessed side walls 140S2E of which at least a portion includes a curved surface.

Figure 11:
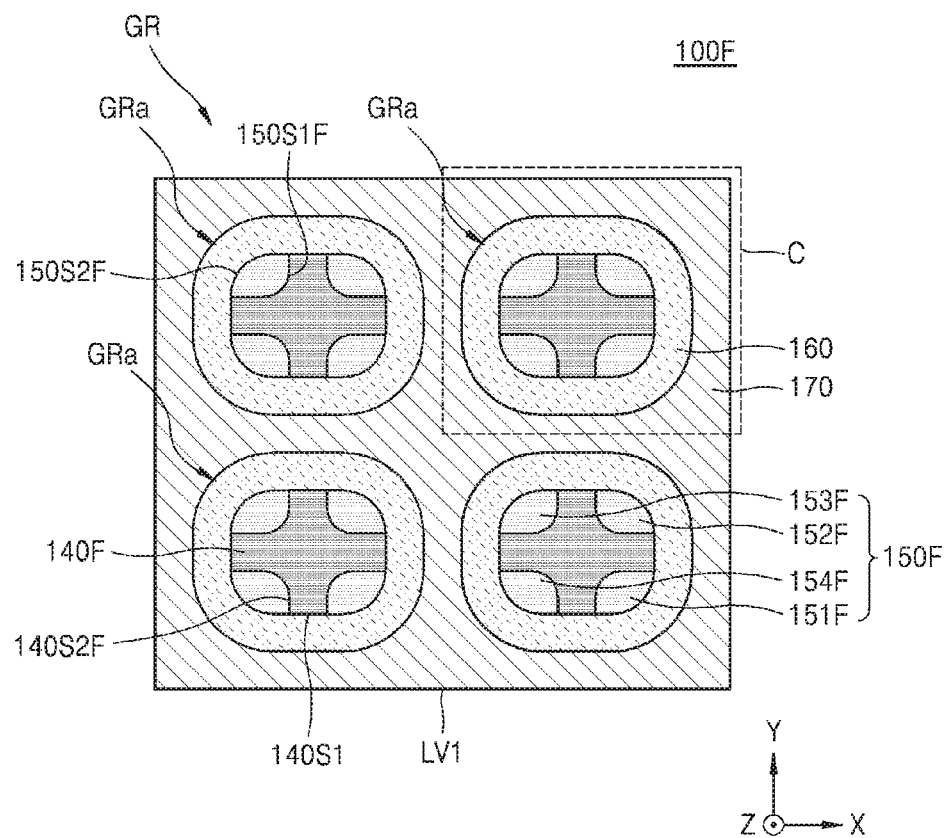
FIG. 11 is a cross-sectional view of an integrated circuit device according to some example embodiments.

FIG. 11 is a cross-sectional view of an integrated circuit device 100F according to some example embodiments. The cross-sectional view illustrated in FIG. 11 corresponds to a horizontal cross-sectional view taken at the first level LV1 in FIG. 3. In FIGS. 1 through 11, like reference numerals denote like elements.

Referring to FIG. 11, a set of lower electrodes 150F may include first to fourth electrodes 151F to 154F. Each of a plurality of support columns 140F may have four protruding side walls 140S1 and four recessed side walls 140S2F between the four protruding side walls 140S1. At least a portion of each of the recessed side walls 140S2F may include a curved surface.

First side surfaces 150S1F of respective lower electrodes 150F in the set may respectively be in contact with the recessed side walls 140S2F of each support column 140F. At least a portion of each of the first side surfaces 150S1F may include a curved surface. In addition, each of the lower electrodes 150F may have a second side surface 150S2F including a curved surface contacting the dielectric layer 160.

Figure 12:
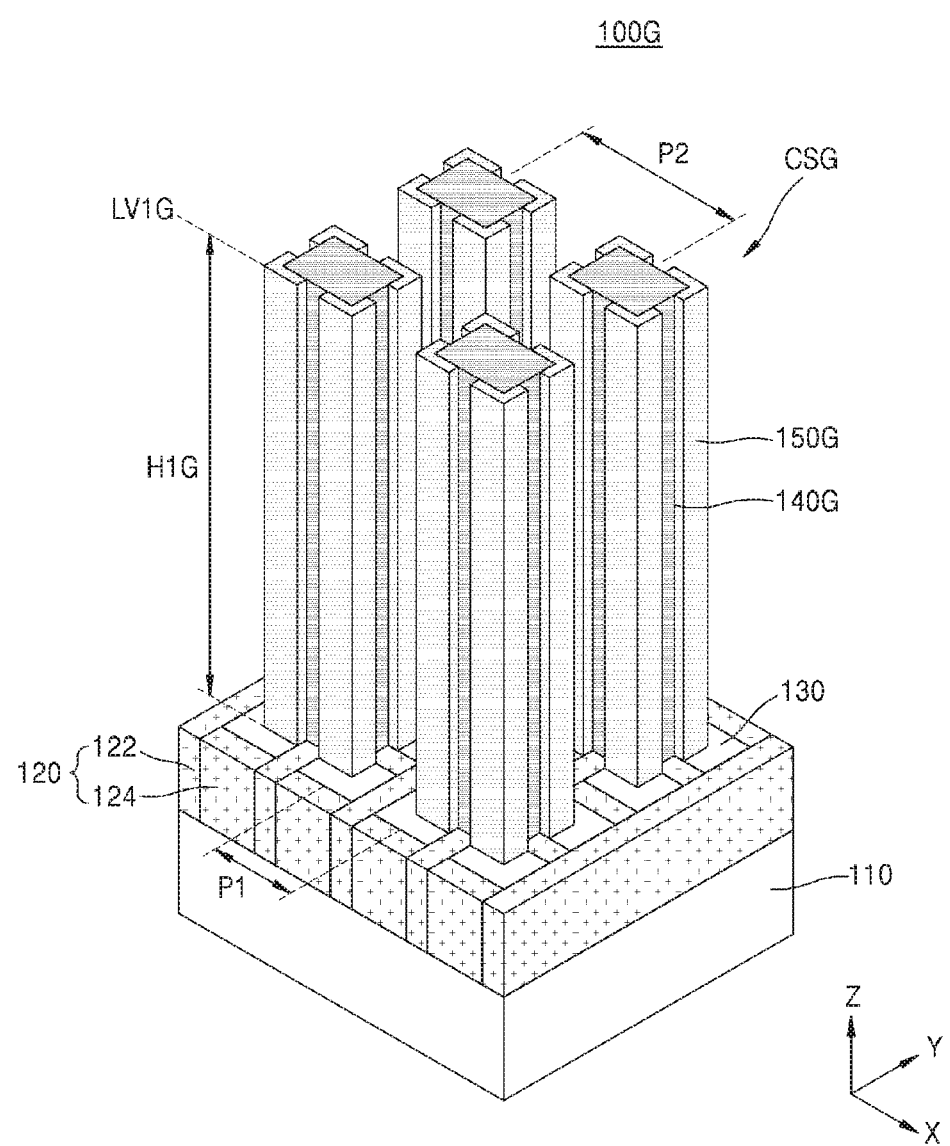
FIG. 12 is a perspective view of an integrated circuit device according to some example embodiments.
Figure 13:
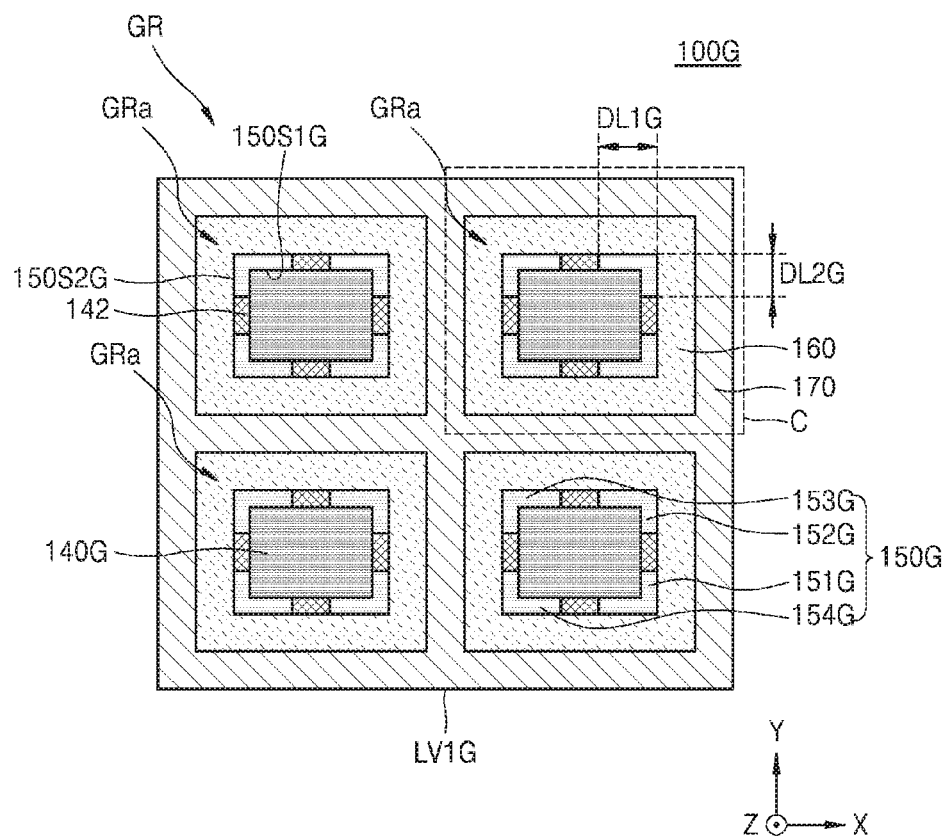
FIG. 13 is a cross-sectional view of the integrated circuit device of FIG. 12, taken at a first level LV1G in FIG. 12, according to some example embodiments.

FIG. 12 is a perspective view of an integrated circuit device 100G according to some example embodiments. FIG. 13 is a cross-sectional view of the integrated circuit device 100G, taken at a first level LV1G in FIG. 12. In FIGS. 1 through 13, like reference numerals denote like elements.

Referring to FIGS. 12 and 13, each of a plurality of support columns 140G may have a rectangular (or square) horizontal cross-section and four corners. The contact structures 130 may be arranged at the first pitch P1. The support columns 140G may be arranged at the second pitch P2 which is about the double of the first pitch P1. Accordingly, each of the support columns 140G may overlap one of two adjacent insulating capping lines 122 and may not overlap the other of two adjacent insulating capping lines 122. Each support column 140G may overlap one of two adjacent insulating fences 124 arranged in the Y direction and may not overlap the other of two adjacent insulating fences 124.

A set of lower electrodes 150G may include first through fourth lower electrodes 151G, 152G, 153G, and 154G which are arranged on the side walls of each support column 140G to be spaced apart from one another. The first through fourth lower electrodes 151G, 152G, 153G, and 154G may be positioned to respectively surround the four corners of the support column 140G. Each of the first through fourth lower electrodes 151G, 152G, 153G, and 154G may have an L-shaped or inverted L-shaped cross-section perpendicular to the Z direction.

Each of the lower electrodes 150G in the set may have two first side surfaces 150S1G contacting the support column 140G and two second side surfaces 150S2G contacting the dielectric layer 160. The two first side surfaces 150S1G may be in contact with one corner of the support column 140G.

An embedded spacer 142 may be positioned on each of the side walls of the support column 140G, e.g., the side wall between the first lower electrode 151G and the second lower electrode 152G, the side wall between the second lower electrode 152G and the third lower electrode 153G, the side wall between the third lower electrode 153G and the fourth lower electrode 154G, and the side wall between the fourth lower electrode 154G and the first lower electrode 151G. The dielectric layer 160 may be positioned on the top and side surfaces of the embedded spacer 142. The embedded spacer 142 may include silicon oxide, silicon oxycarbide, or a low-k (low dielectric constant) insulating material. The first through fourth lower electrodes 151G, 152G, 153G, and 154G may be spaced apart from each other and separated from each other by the embedded spacers 142.

The embedded spacer 142 may be positioned between two adjacent lower electrodes 150G in the set of the lower electrodes 150G. Accordingly, undesirable coupling capacitance, which may occur between adjacent lower electrodes 150G through the dielectric layer 160 positioned therebetween when the embedded spacer 142 is omitted, may be decreased.

The embedded spacers 142 may be spaced apart from each other between the outer surface of the support column 140G and the inner surface of a dielectric protrusion in the dielectric layer 160. The embedded spacers 142 may separate the lower electrodes 151, 152G, 153G, and 154G from each other.

Two second side surfaces 150S2G of each lower electrode 150G face the upper electrode 170 with the dielectric layer 160 therebetween, and therefore, the effective surface area of a cell with a capacitor structure CSG including one lower electrode 150G may be the sum of the areas of the two second side surfaces 150S2G, e.g., (DL1G+DL2G)×H1G.

Even through the set of the lower electrodes 150G has the first height H1G which is relatively small, capacitance required for a cell with the capacitor structure CSG may be obtained. Accordingly, tilting of the lower electrodes 150G that may occur during a manufacturing process of the lower electrodes 150G may be limited and/or prevented.

In an example manufacturing process of the lower electrodes 150G, island-type support columns 140G arranged at the second pitch P2 may be formed first. A lower electrode layer 150GL (see FIG. 24) may be formed on the side wall of each of the support columns 140G. Thereafter, the lower electrode layer 150GL may be partially etched to form the set of the lower electrodes 150G at the side wall of each support column 140G. At this time, the etching process of the lower electrode layer 150GL may be performed in a relatively wide space between the support columns 140G, and therefore, difficulty of the etching process of the lower electrode layer 150GL may be decreased.

Figure 14:
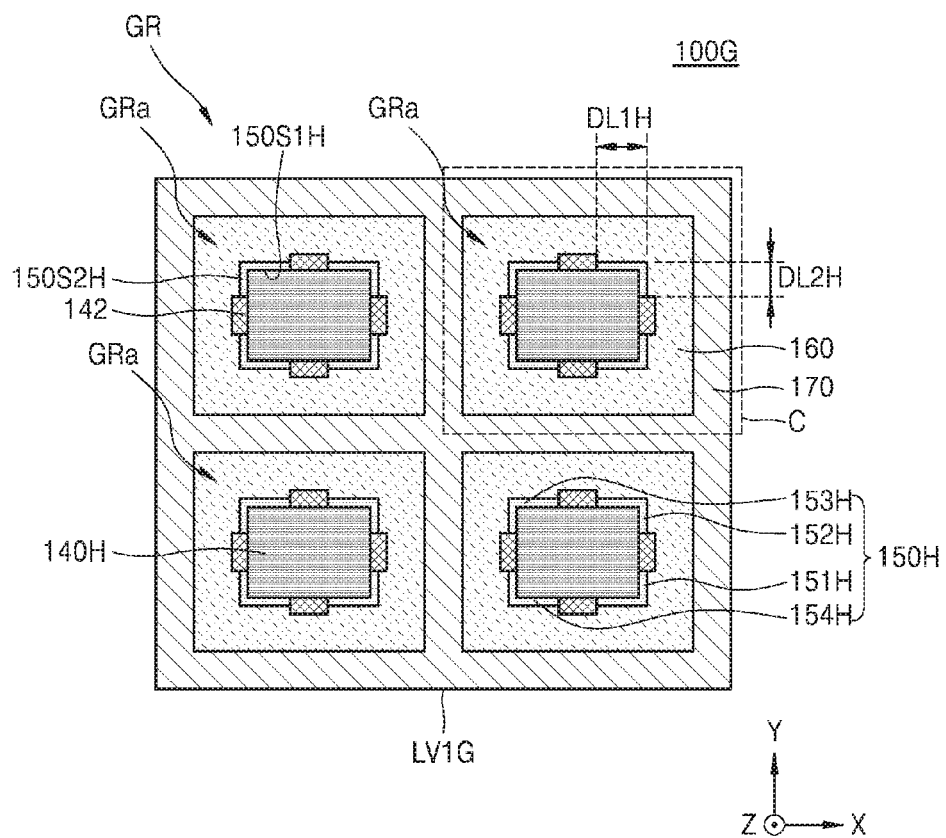
FIG. 14 is a cross-sectional view of the integrated circuit device of FIG. 12, taken at a first level LV1G in FIG. 12, according to some example embodiments.

FIG. 14 is a cross-sectional view of the integrated circuit device of FIG. 12, taken at a first level LV1G in FIG. 12, according to some example embodiments. In FIGS. 1 through 14, like reference numerals denote like elements.

Referring to FIG. 14, an integrated circuit device 100H according to some example embodiments may be similar to the integrated circuit device 100G described in FIGS. 12-13, except a width of the lower electrodes 150H in the X-direction and/or Y-direction may be different. For example, in a plan view, each one of the embedded spacers 142 may protrude in the X direction or the Y direction from an adjacent two of lower electrodes 150H. Each embedded spacer 142 may directly contact a nearby support column 140H. Each embedded spacer 142 may be coplanar with a first side surface 150S1H of a nearby lower electrode 150 and may protrude from a second side surface 150S2H of the nearby lower electrode 150.

In the integrated circuit device 100H, undesirable coupling capacitance, which may occur among the lower electrodes 150H in the set through the dielectric layer 160 contacting the second side surfaces 150S2H of the lower electrodes 150H, may be decreased by forming the embedded spacer 142 to protrude from the second side surface 150S2H of two nearby lower electrodes 150H. In addition, a capacitor's effective surface area between each lower electrode 150H and the upper electrode 170 may be increased, and therefore, the height of the lower electrode 150H may be decreased and difficulty of a process of forming the support column 140 and a process of etching the lower electrode 150H may also be decreased.

Figure 15:
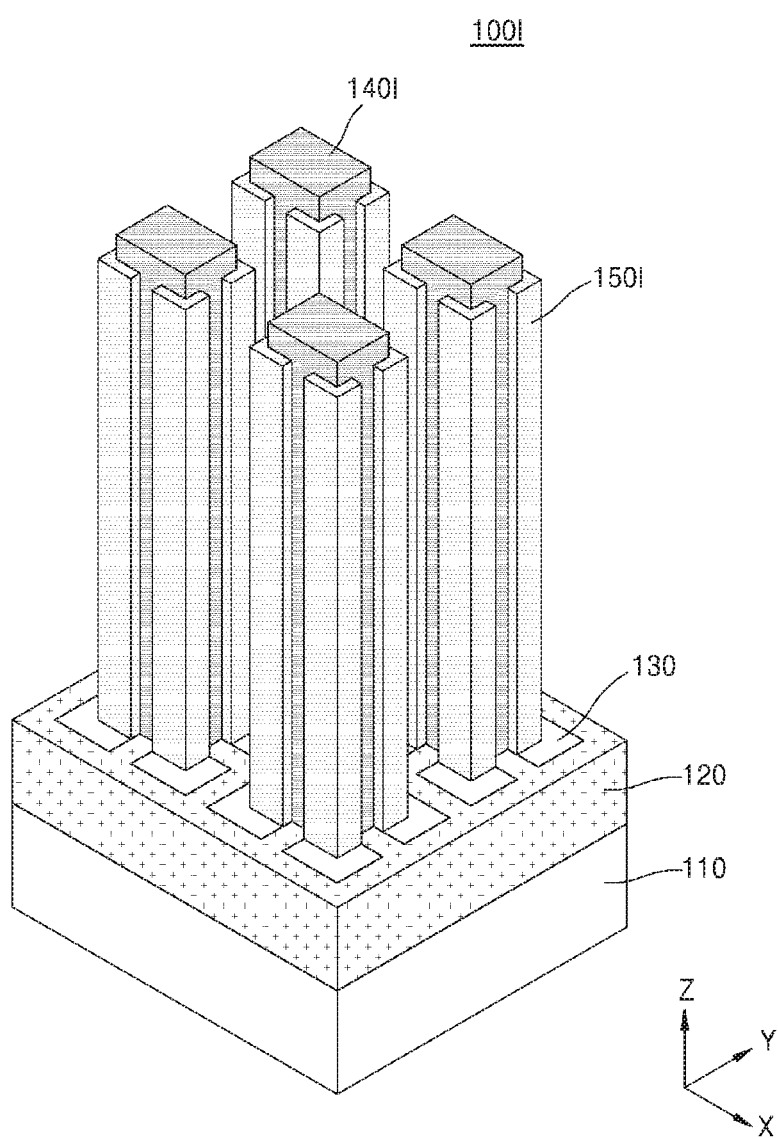
FIG. 15 is a perspective view of an integrated circuit device according to some example embodiments.

FIG. 15 is a perspective view of an integrated circuit device according to some example embodiments. In FIGS. 1 through 15, like reference numerals denote like elements. The dielectric layer 160 and upper electrode 170 are omitted in FIG. 15 for ease of description.

Referring to FIG. 15, a height of the support column 140I may be greater than a height of lower electrode 150I. Since the top surface of the support column 140I is higher than the top surface of the set of the lower electrodes 150I, the length of an electrical path between adjacent lower electrodes 150I in the set of the lower electrodes 150I through the dielectric layer 160 may increase. Accordingly, undesirable coupling capacitance that may occur between the lower electrodes 150I in the set through the dielectric layer 160 contacting the top surfaces of the lower electrode 150I may be decreased.

Figure 16:
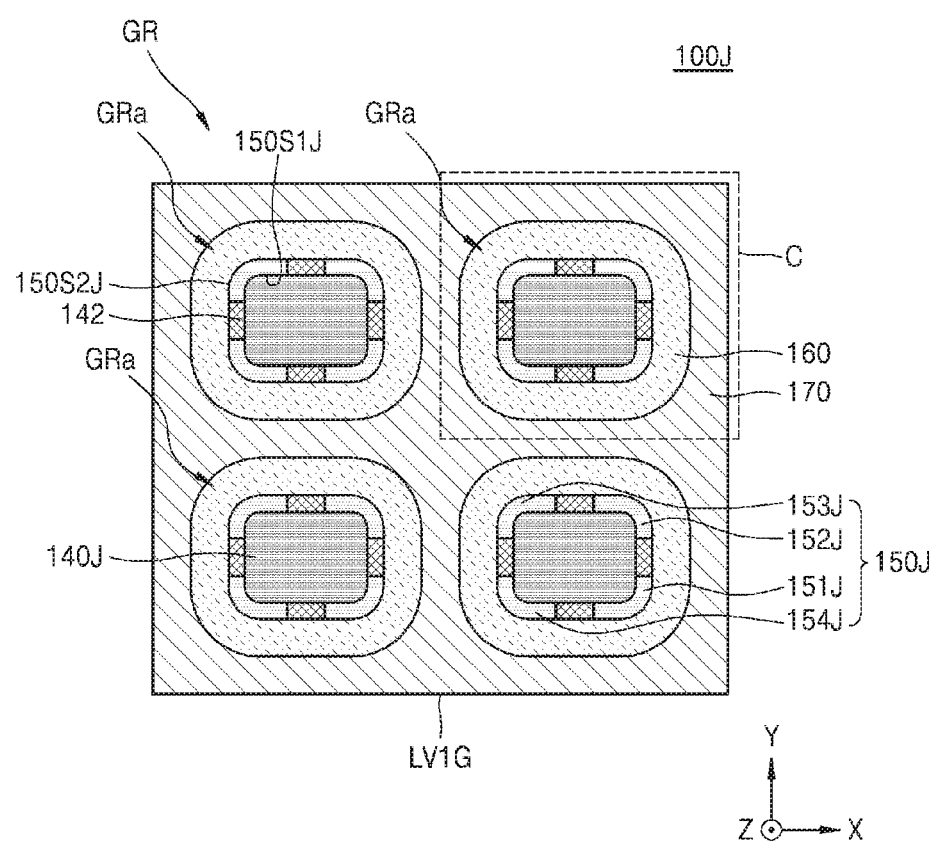
FIG. 16 is a cross-sectional view of an integrated circuit device according to some example embodiments.

FIG. 16 is a cross-sectional view of an integrated circuit device 100H according to some example embodiments. The cross-sectional view illustrated in FIG. 16 corresponds to a horizontal cross-sectional view taken at the first level LV1G in FIG. 12. In FIGS. 1 through 15, like reference numerals denote like elements.

Referring to FIG. 16, a horizontal cross-section of the support column 140J taken at the first level LV may have a rectangular shape with rounded corners in a plan view or a square shape with rounded corners in a plan view. Each of a plurality of support columns 140J may have a rectangular cross-section with rounded corners. In other words, the corners of each support column 140J may include a curved surface. A set of lower electrodes 150J may be positioned to surround the rounded corners of the support column 140J. For example, each of first through fourth lower electrodes 151J, 152J, 153J, and 154J may include a first side surface 150S1J including a curved surface and a second side surface 150S2J including a curved surface. The first side surface 150S1J may be in contact with the support column 140J and the second side surface 150S2J may be in contact with the dielectric layer 160.

Figure 17:
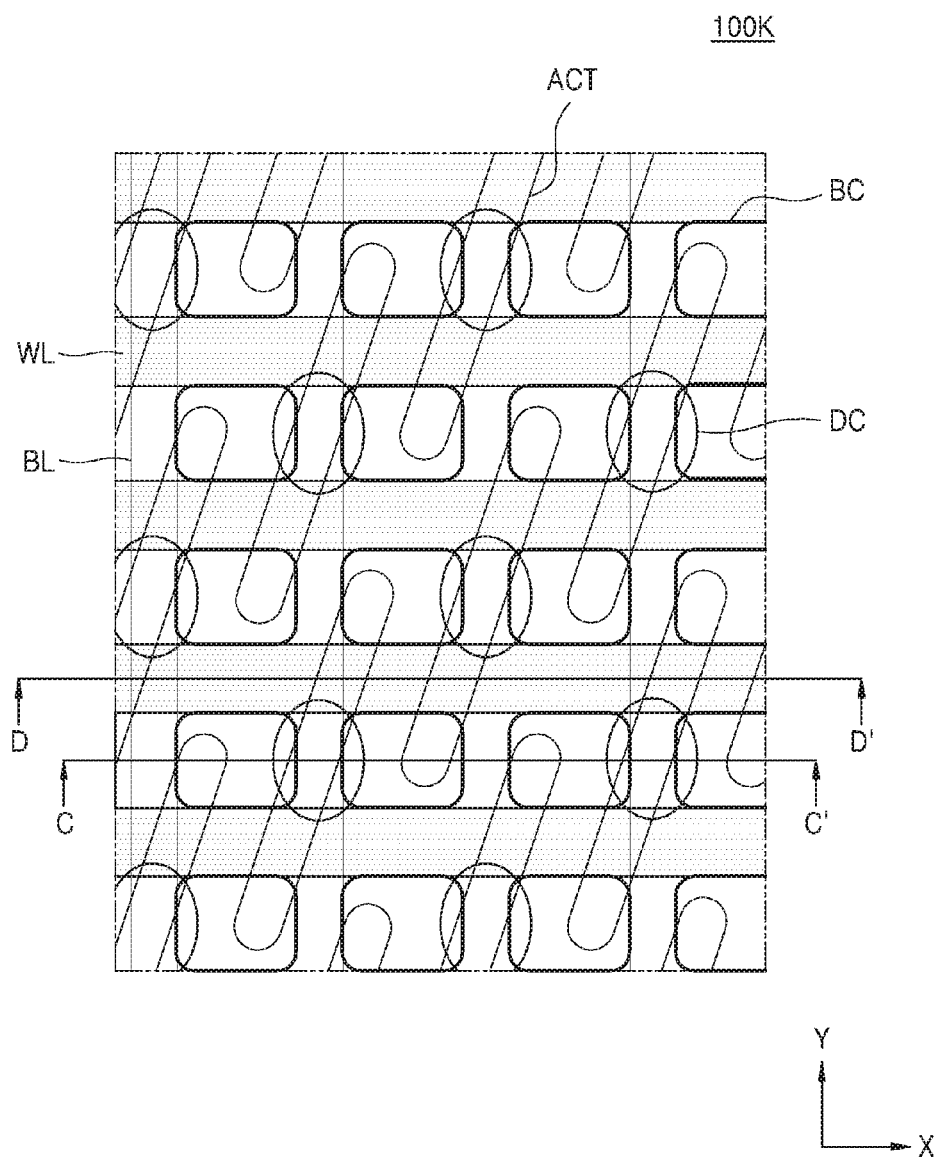
FIG. 17 is a layout diagram of an integrated circuit device according to some example embodiments.
Figure 18:
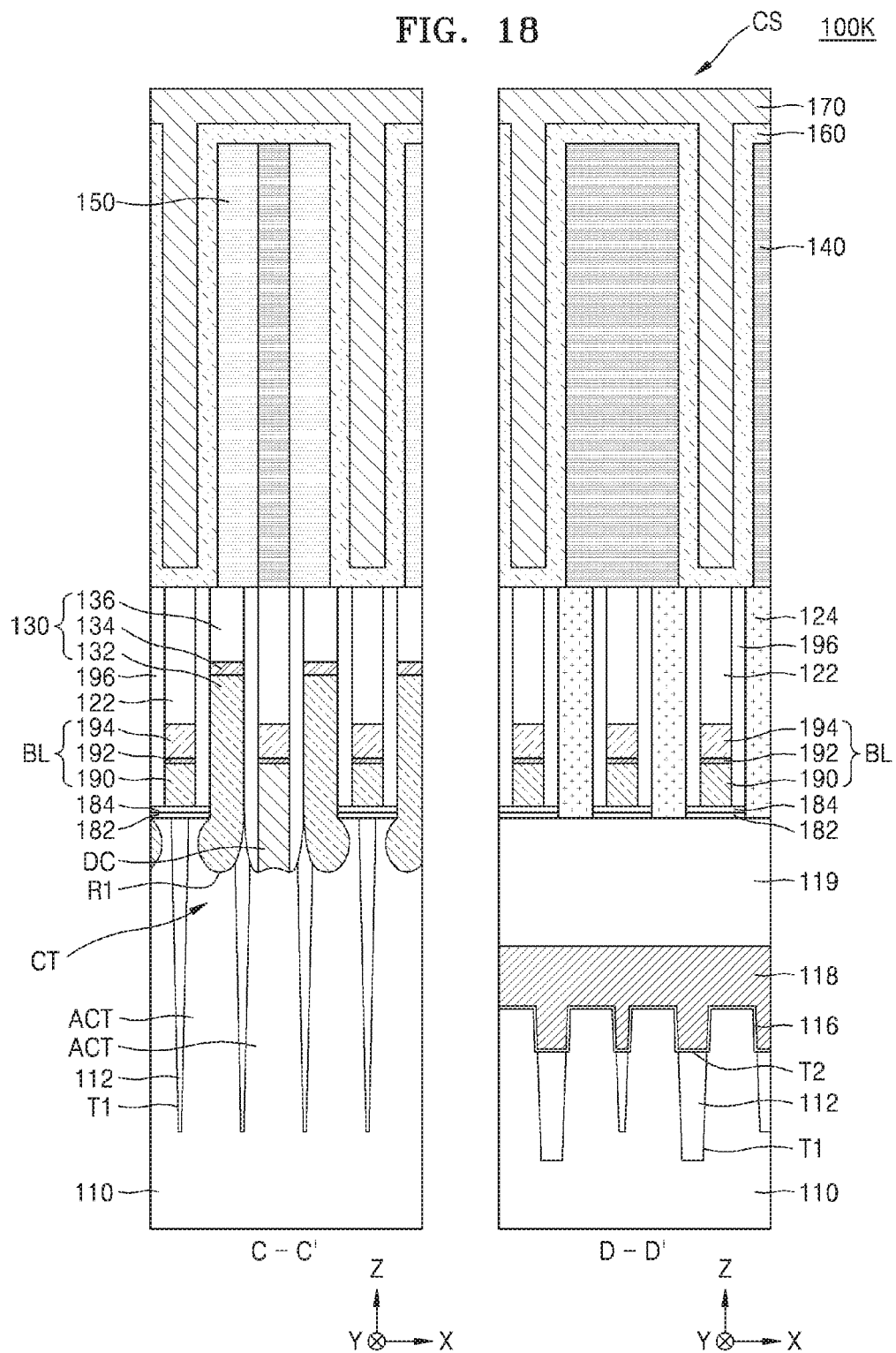
FIG. 18 is a cross-sectional view of the integrated circuit device of FIG. 15, taken along lines C-C' and D-D' in FIG. 17.

FIG. 17 is a layout diagram of an integrated circuit device 100K according to some example embodiments. FIG. 18 is a cross-sectional view of the integrated circuit device 100K, taken along lines C-C' and D-D' in FIG. 17. In FIGS. 1 through 18, like reference numerals denote like elements.

Referring to FIG. 17, a plurality of active regions ACT may be arranged horizontally extending in a diagonal direction to the X and Y directions on a plane in the integrated circuit device 100I. A plurality of word lines WL may extend in the X direction crossing the active regions ACT to be parallel with one another. A plurality of bit lines BL may extend over the word lines WL in the Y direction crossing the X direction to be parallel with one another. The bit lines BL may be connected to the active regions ACT through a direct contact DC.

A plurality of buried contacts BC may be formed between two adjacent bit lines among the bit lines BL. A lower electrode 150 (see FIG. 18) of each capacitor structure CS may be positioned above one of the buried contacts BC. The buried contact BC may connect the lower electrode 150 to an active region ACT.

Referring to FIG. 18, an isolation layer 112 may be positioned in an isolation trench T1 of the substrate 110. The active region ACT may be defined in the substrate 110 by the isolation layer 112. A plurality of word line trenches T2 may be formed in the substrate 110 to extend in parallel with one another in the X direction and cross the active region ACT. A gate dielectric layer 116, a word line 118, and a word line capping layer 119 may be sequentially stacked in each of the word line trenches T2.

The gate dielectric layer 116 may include at least one selected from among a silicon oxide layer, a silicon nitride layer, a silicon oxynitride layer, oxide/nitride/oxide (ONO), and a high-k layer having a dielectric constant higher than that of a silicon oxide layer. For example, the gate dielectric layer 116 may have a dielectric constant of about 10 to about 25. In some embodiments, the gate dielectric layer 116 may include $HfO_2$, $Al_2O_3$, $HfAlO_3$, $Ta_2O_3$, $TiO_2$, or a combination thereof, but inventive concepts is not limited thereto. The word line 118 may include Ti, TiN, Ta, TaN, W, WN, TiSiN, WSiN, or a combination thereof. The word line capping layer 119 may include silicon oxide, silicon nitride, silicon oxynitride, or a combination thereof.

A first insulating layer 182 and a second insulating layer 184 may be sequentially positioned on the word line capping layer 119, the isolation layer 112, and the substrate 110. The first insulating layer 182 may include silicon oxide and the second insulating layer 184 may include silicon nitride.

A plurality of the bit lines BL may extend in parallel with one another in the Y direction on the second insulating layer 184. The bit lines BL may include a first conductive line 190, a second conductive line 192, and a third conductive line 194, which are sequentially stacked on the second insulating layer 184. The first conductive line 190 may include doped polysilicon. The second conductive line 192 and the third conductive line 194 may include TiN, TiSiN, W, tungsten silicide, or a combination thereof. A plurality of the insulating capping lines 122 may extend in parallel with one another in the Y direction on the bit lines BL.

An insulating spacer 196 may be formed on a side wall of each of the bit lines BL and a side wall of each of the insulating capping lines 122. The insulating spacer 196 may include silicon oxide, silicon nitride, silicon oxynitride, or a combination thereof. The insulating spacer 196 may have a stack structure including a plurality of insulating layers which respectively include different materials.

The direct contact DC may be positioned at an intersection between each of the bit line BL and each of the active regions ACT to be recessed from the top surface of the substrate 110 by a desired (and/or alternatively predetermined) depth. The direct contact DC may include doped polysilicon, but inventive concepts is not limited thereto. The second conductive line 192 may be positioned on the direct contact DC. The top surface of the direct contact DC may at the same level as the top surface of the first conductive line 190.

A plurality of insulating fences 124 may be positioned spaced apart in the Y direction between the insulating capping lines 122. The upper portions of the insulating fences 124 may be positioned between the insulating capping lines 122 and the lower portions of the insulating fences 124 may be positioned between the bit lines BL.

A plurality of the contact structures 130 may be respectively positioned in spaces defined by the insulating capping lines 122 and the insulating fences 124. Each of the contact structures 130 may include the lower conductive plug 132, the metal silicide layer 134, and the upper conductive plug 136. The lower conductive plug 132 may fill a first recess region R1 recessed from the top surface of the substrate 110 by a desired (and/or alternatively predetermined) depth. Each contact structure 130 may connect to a different cell transistor CT in the substrate 110.

A plurality of the support columns 140 may be arranged on the insulating capping lines 122 and the insulating fences 124. A capacitor structure CS including the lower electrode 150, the dielectric layer 160, and the upper electrode 170 may be formed on the contact structures 130. The lower electrode 150 may be positioned at a side wall of each of the support columns 140. The technical characteristics of the support columns 140 and the capacitor structure CS may be similar to those described with reference to FIGS. 1 through 4.

In some example embodiments, a plurality of the support columns 140 and a plurality of the lower electrodes 150 may be arranged in the X and Y directions. Each lower electrode 150 may be formed directly on one of the contact structures 130. In this case, a process of forming a landing pad (not shown) may be omitted.

In some example embodiments, the above-described integrated circuit devices 100, 100A, 100B, 100C, 100D, 100E, 100F, 100G, 100H, 100I, 100J, and 100K may be memory devices. As shown in FIGS. 4, 7, 8, 9, 10, 11, 13, 14, and 16, a cell C of the memory device may be may be defined by a portion of the upper electrode 170 surrounding a portion of the dielectric layer 160, and a set of four lower electrode (e.g., the lower electrodes 151 to 154 in FIG. 4).

FIGS. 19 through 23 are perspective views of stages in a method of manufacturing the integrated circuit device 100, according to some example embodiments. In FIGS. 1 through 23, like reference numerals denote like elements.

Figure 19:
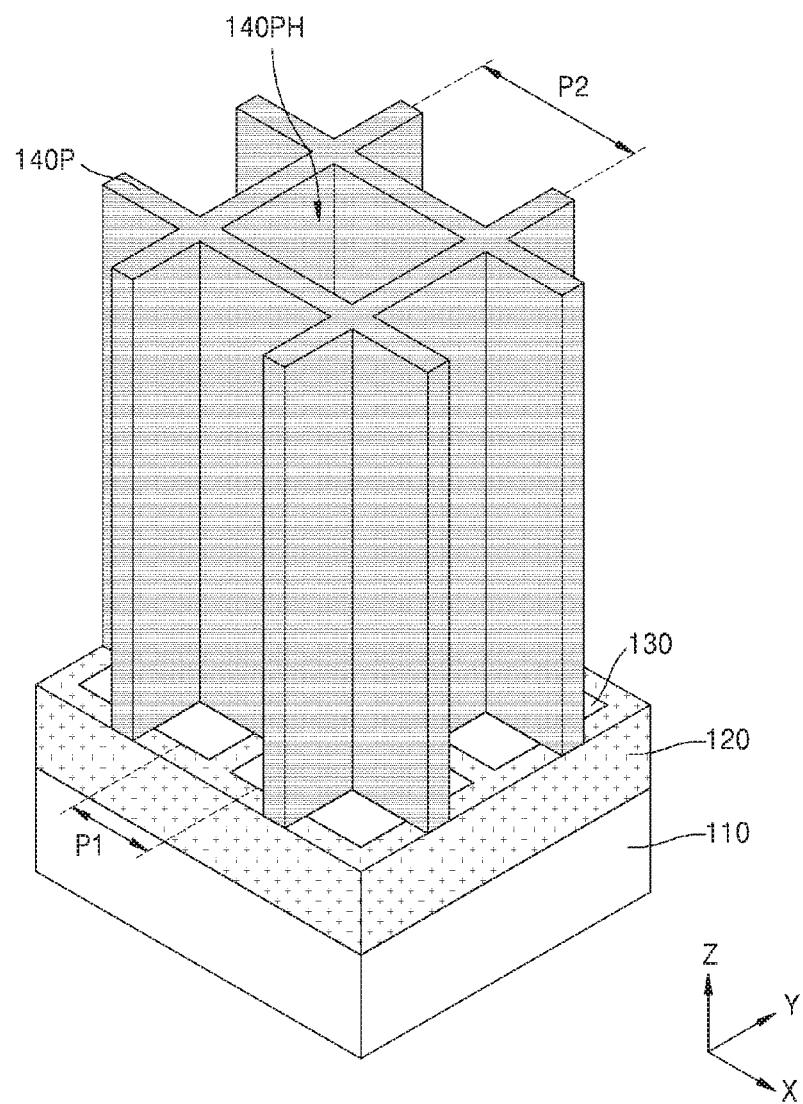
FIGS. 19 through 23 are perspective views of stages in a method of manufacturing an integrated circuit device, according to some example embodiments.

Referring to FIG. 19, a plurality of the insulating capping lines 122 (see FIG. 1) are formed using an insulating material on the substrate 110 to extend in the Y direction. Thereafter, an insulating layer (not shown) may be buried between two adjacent insulating capping lines 122 and then partially etched back to form a plurality of the insulating fences 124 (see FIG. 1) spaced apart in the Y direction between the two adjacent insulating capping lines 122. Here, the insulating capping lines 122 and the insulating fences 124 may constitute the insulating structure 120.

Thereafter, a plurality of the contact structures 130 may be formed by filling spaces between the insulating capping lines 122 and the insulating fences 124 with conductive materials. The descriptions made with reference to FIGS. 1 through 4 may be referred to for the materials of the contact structures 130.

Thereafter, an insulating layer (not shown) may be formed on the insulating structure 120 and the contact structures 130. A mask pattern (not shown) may be formed on the insulating layer. The insulating layer may be etched using the mask pattern to form the support column structure 140P. The support column structure 140P may include a plurality of the first openings 140PH. The first openings 140PH may be arranged at the second pitch P2 in the X and Y directions. In some example embodiments, the support column structure 140P may have a grid shape including a plurality of lattices.

In some example embodiments, the support column structure 140P may be formed to expose the top surfaces of the contact structures 130 through the first openings 140PH.

Figure 20:
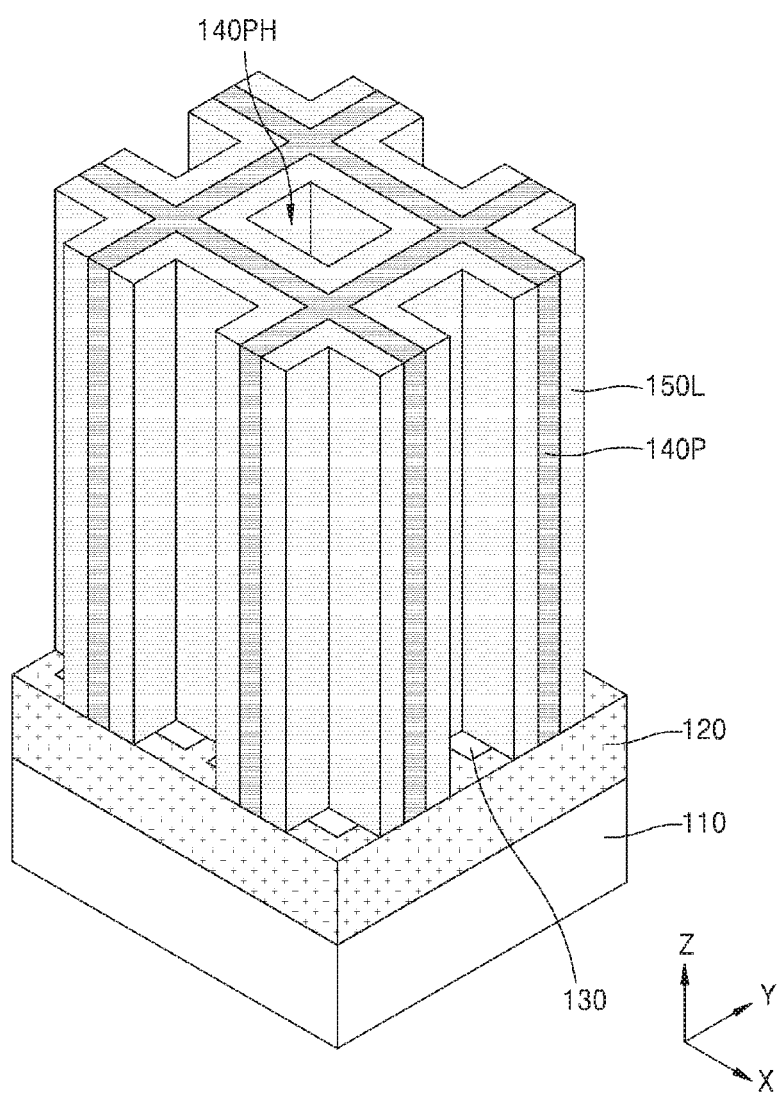

Referring to FIG. 20, after a conductive layer (not shown) is formed on the insulating structure 120, the contact structures 130, and the support column structure 140P, the lower electrode layer 150L may be formed on the side wall of the support column structure 140P by performing anisotropic etching on the conductive layer. For example, the lower electrode layer 150L may be formed using an atomic layer deposition (ALD) process or a chemical vapor deposition (CVD) process.

The lower electrode layer 150L may be in contact with the top surfaces of the contact structures 130. A portion of the conductive layer covering the top surface of the insulating structure 120 may be removed by the anisotropic etching to expose the top surface of the insulating structure 120 at the bottom of each first opening 140PH.

Figure 21:
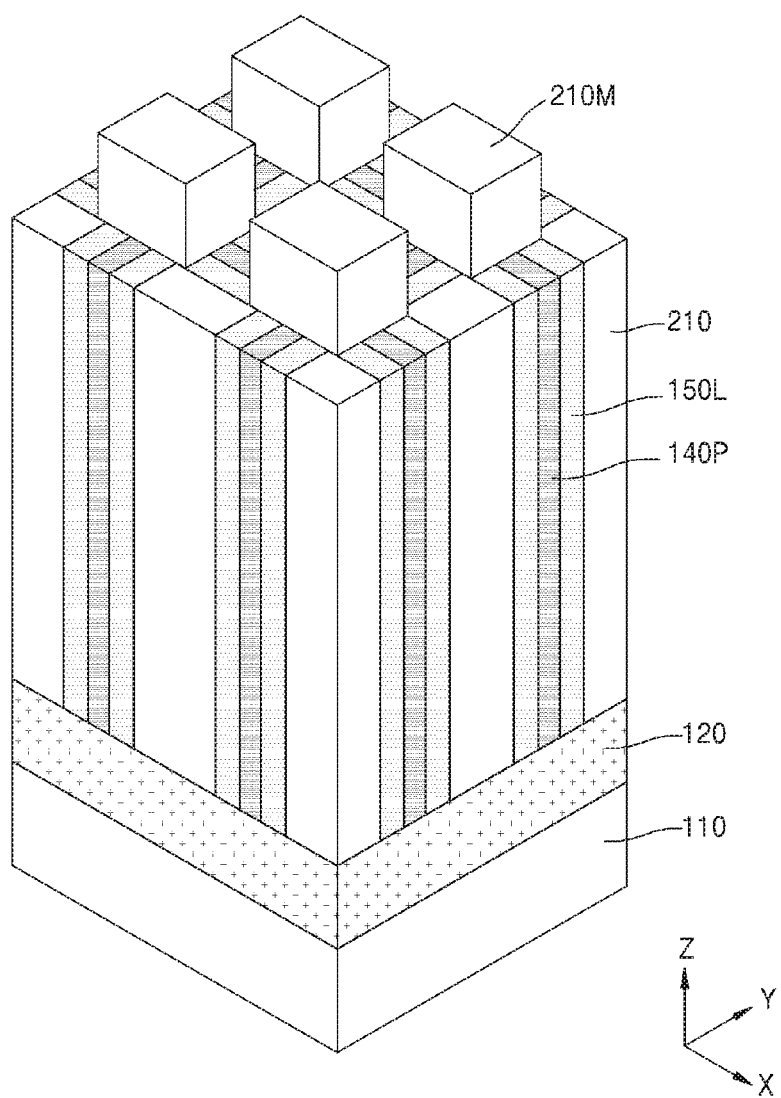

Referring to FIG. 21, an insulating layer (not shown) may be formed on the support column structure 140P and the lower electrode layer 150L. A top portion of the insulating layer may be planarized until the top surfaces of the support column structure 140P and the lower electrode layer 150L are exposed to form a filling insulating layer 210 filling the first openings 140PH. For example, the filling insulating layer 210 may be formed using silicon carbonitride ($SiC_xN_y$), silicon oxycarbonitride ($SiO_xC_yN_z$), or a spin-on hardmask (SOH) material.

Thereafter, the mask pattern 210M may be formed on the support column structure 140P, the lower electrode layer 150L, and the filling insulating layer 210. For example, the mask pattern 210M may be formed using silicon carbonitride ($SiC_xN_y$), silicon oxycarbonitride ($SiO_xC_yN_z$), or an SOH material.

Figure 22:
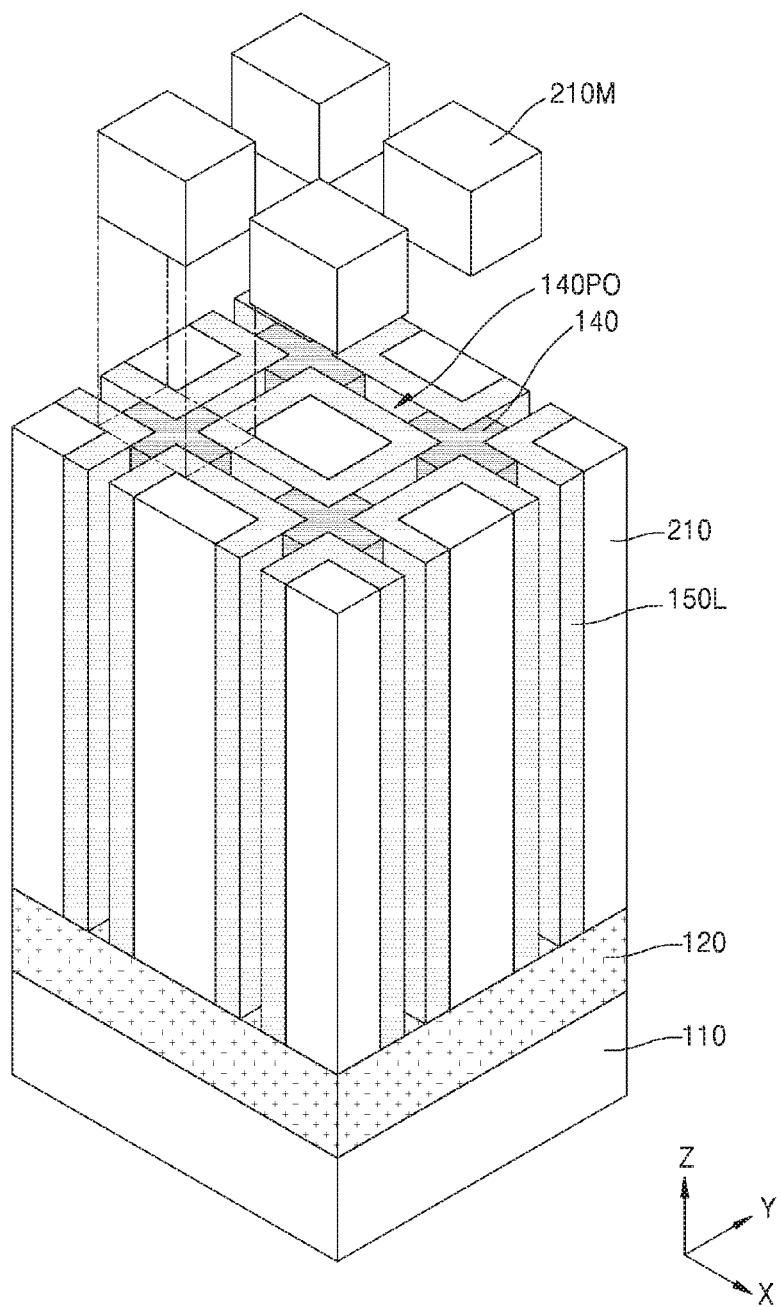

Referring to FIG. 22, portions of the support column structure 140P (see FIG. 21), which are not covered by the mask pattern 210M, may be removed using the mask pattern 210M as an etch mask. Accordingly, second openings 140PO may be formed where the portions of the support column structure 140P have been removed, so that a plurality of the support columns 140 may be formed from the support column structure 140P. The support columns 140 each may have a cross-shaped horizontal cross-section. The top surface of the insulating structure 120 may be exposed at the bottoms of the second openings 140PO.

The etching process of the support column structure 140P may be a wet etching process or a dry etching process using an etch selectivity. The lower electrode layer 150L may not be removed during the etching process, and the side walls of the lower electrode layer 150L may be exposed by the second openings 140PO over the entire height thereof.

Figure 23:
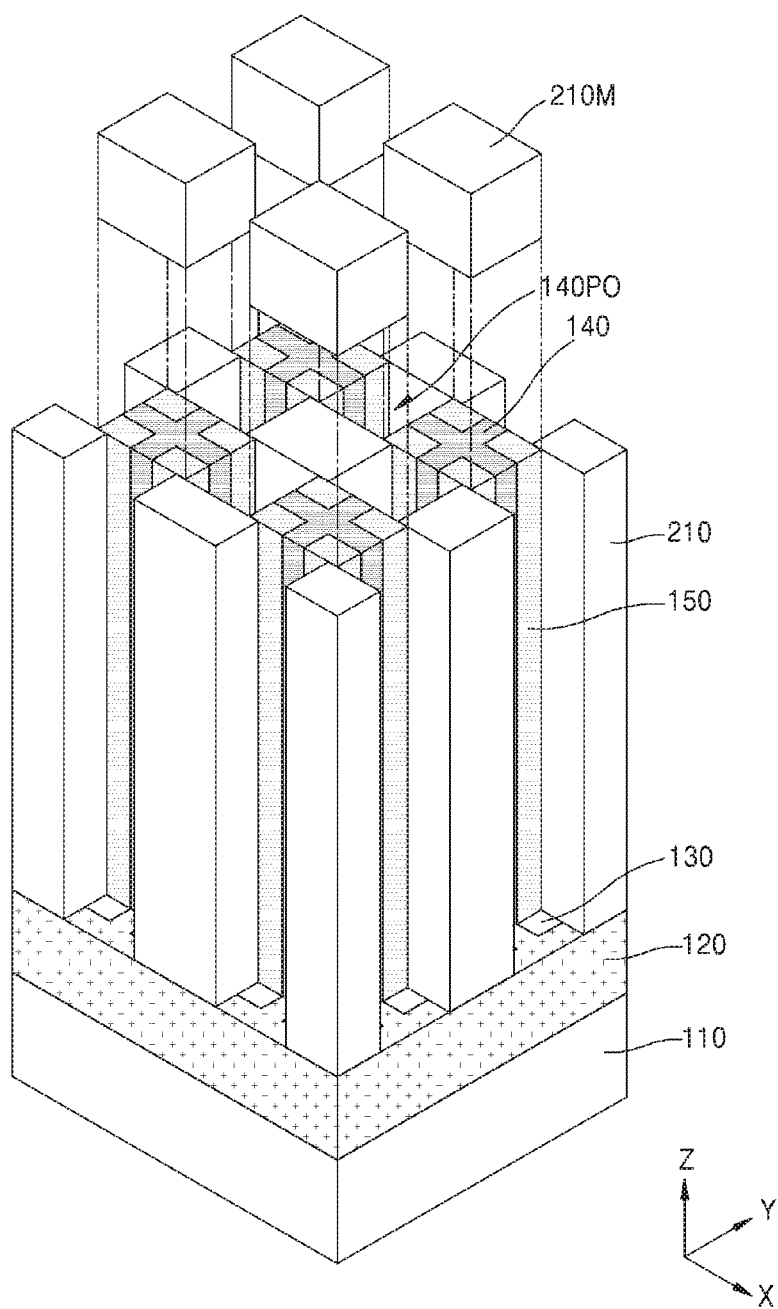

Referring to FIG. 23, portions of the lower electrode layer 150L (see FIG. 20), which not covered by the mask pattern 210M, may be removed using the mask pattern 210M as an etch mask. Accordingly, the second openings 140PO may be expanded to the portions of the lower electrode layer 150L that have been removed, and a plurality of the lower electrodes 150 may be formed from the lower electrode layer 150L. The lower electrodes 150 may respectively be in contact with four side surfaces of each of the support columns 140 and each may have a bar-shaped horizontal cross-section.

In some example embodiments, the removing process for forming the lower electrodes 150 may be an isotropic wet etching process or an isotropic dry etching process. For example, the portions of the lower electrode layer 150L which are exposed at the inner walls of the second openings 140PO, may be removed during the etching process. In other words, the lower electrode layer 150L may be etched from the inner walls of the second openings 140PO in a lateral direction, e.g., a horizontal direction (e.g., the X or Y direction). Since an etchant or an etching gas may be provided into the second openings 140PO relatively uniformly, the etching amount of the lower electrode layer 150L may be relatively uniform over the entire height from the top to the bottom of the lower electrode layer 150L. Accordingly, the etching process of the lower electrodes 150 may be precisely controlled, and difficulty of the etching process may be decreased.

Thereafter, referring back to FIGS. 1 and 2, the mask pattern 210M (see FIG. 21) may be removed, and the filling insulating layer 210 (see FIG. 23) may also be removed. Accordingly, a structure including the support columns 140 and the lower electrodes 150 which are arranged at the second pitch P2 may be obtained.

Thereafter, the dielectric layer 160 may be formed on the support columns 140 and the lower electrodes 150. For example, the dielectric layer 160 may be formed using ALD or CVD. The upper electrode 170 may be formed on the dielectric layer 160. The upper electrode 170 may be formed to surround the support columns 140 and the lower electrodes 150 in the X and Y directions.

The integrated circuit device 100 may be completed by performing the processes described above.

According to conventional manufacturing methods in which a support member having a bar-shaped cross-section and a lower electrode layer provided at the side surfaces of the support member are etched to form a plurality of support members and a plurality of lower electrode layers, the etching amount of the lower electrode layer may be less at the bottom portion thereof than at the upper portion thereof.

Accordingly, it may be difficult to precisely control the etching process of the lower electrode layer. In addition, the support member having the bar-shaped cross-section may lean, bow or collapse during the etching process.

However, according to the method described above, the support column structure 140P having a plurality of the first openings 140PH arranged at a relatively large pitch (e.g., the second pitch P2 which is about the double of the first pitch P1) may be formed first, and the support column structure 140P may be etched to form a plurality of the support columns 140. Accordingly, difficulty of the process of forming the support columns 140 may be decreased.

In addition, the lower electrodes 150 may be formed by performing an isotropic etching process in the lateral direction through the second openings 140PO expanded during the etching process. Accordingly, an etching source or an etchant may be uniformly supplied down to the bottoms of the second openings 140PO. As a result, the etching process of the lower electrodes 150 may be precisely controlled.

In example embodiments, unlike the descriptions made above with reference to FIG. 19, the first openings 140PH may be formed to have a cross-section having an elliptical shape, a round-cornered rectangular shape, a round-cornered square shape, or a circular shape instead of a rectangular cross-section. In this case, the support column 140E or 140F having the recessed side wall 140S2E or 140S2F including a curved surface may be formed, and therefore, the integrated circuit device 100E or 100F described with reference to FIG. 10 or 11 may be formed.

Unlike the descriptions made above with reference to FIG. 21, the mask pattern 210M may have a cross-section having a diamond shape, an octagon shape, a round-cornered rectangular shape, a round-cornered square shape, or an elliptical shape. In this case, the lower electrode 150C having a triangular cross-section may be formed, and therefore, the integrated circuit device 100C described with reference to FIG. 8 may be formed. Alternatively, the lower electrode 150D or 150F having a side surface including a curved surface may be formed, and therefore, the integrated circuit device 100D or 100F described with reference to FIG. 9 or 11 may be formed.

After the process described with reference to FIG. 23 is performed, an etch-back process may be performed on the upper portion of the lower electrode 150A to remove the upper portion of the lower electrode 150A by a desired (and/or alternatively predetermined) height. In this case, the integrated circuit device 100A described with reference to FIG. 6, in which the level LV1A of the top surface of the lower electrode 150A is lower than the level LV2A of the top surface of the support column 140A, may be formed.

After the process described with reference to FIG. 23 is performed, the filling insulating layer 210 may be removed, and then a side wall portion of the lower electrode 150B may be removed by a desired (and/or alternatively predetermined) thickness by performing a trimming process or a wet etching process. In this case, the integrated circuit device 100B described with reference to FIG. 7 may be formed.

Figure 24:
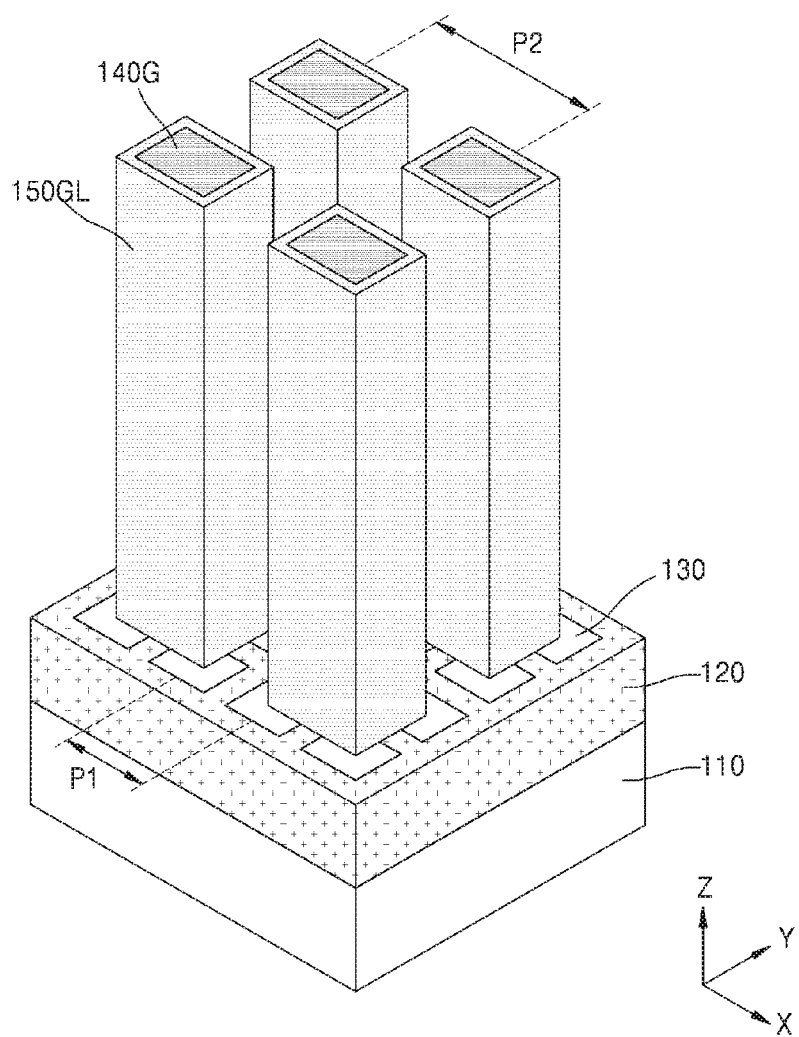
FIGS. 24 through 26 are perspective views of stages in a method of manufacturing an integrated circuit device, according to some example embodiments.
Figure 25:
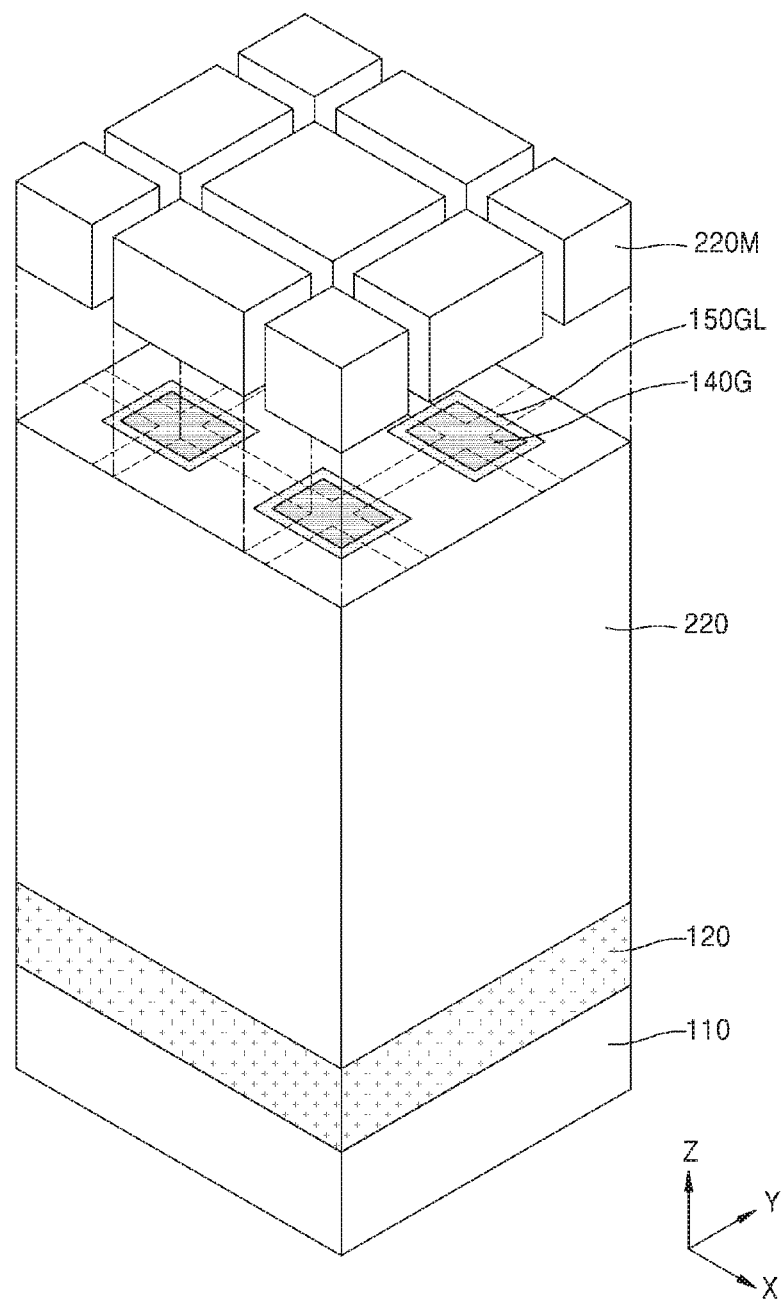
Figure 26:
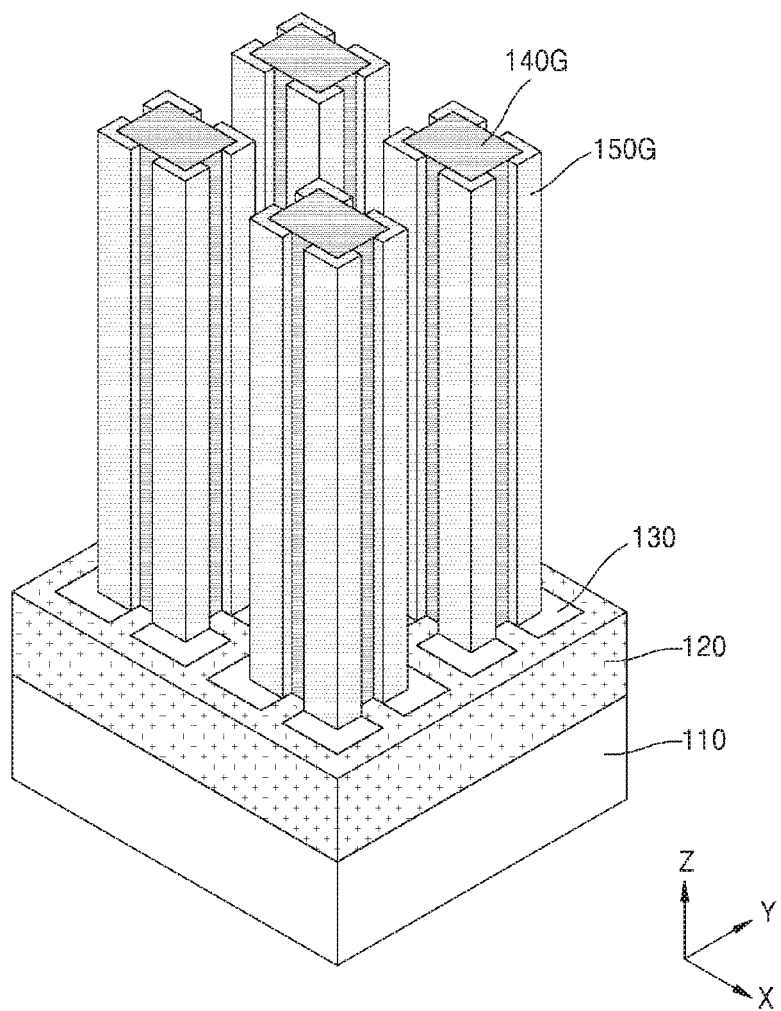

FIGS. 24 through 26 are perspective views of stages in a method of manufacturing an integrated circuit device 100G, according to some example embodiments. In FIGS. 1 through 26, like reference numerals denote like elements.

The insulating structure 120 and a plurality of the contact structures 130 may be formed on the substrate 110 by performing the processes described with reference to FIG. 19.

Referring to FIG. 24, an insulating layer (not shown) may be formed on the insulating structure 120 and the contact structures 130 and then patterned to form a plurality of the support columns 140G arranged at the second pitch P2 in the X and Y directions. For example, the support columns 140G may have a rectangular horizontal cross-section.

Thereafter, a conductive layer (not shown) may be formed on the insulating structure 120, the contact structures 130, and the support columns 140G. Anisotropic etching may be performed on the conductive layer to form the lower electrode layer 150GL on the side wall of each of the support columns 140G.

The lower electrode layer 150GL may be formed to cover the entire side wall of each support column 140G. The lower electrode layer 150GL formed on the side wall of each support column 140G may not be connected to the lower electrode layer 150GL formed on the side wall of another adjacent support column 140G.

Referring to FIG. 25, an insulating layer (not shown) may be formed on the support columns 140G and a plurality of lower electrode layers 150GL. A top portion of the insulating layer may be planarized until the top surfaces of the support columns 140G and the lower electrode layers 150GL are exposed to form a filling insulating layer 220 surrounding the support columns 140G and the lower electrode layers 150GL. For example, the filling insulating layer 220 may be formed using silicon carbonitride ($SiC_xN_y$), silicon oxycarbonitride ($SiO_xC_yN_z$), or an SOH material.

Thereafter, a mask pattern 210M may be formed on the support columns 140G, the lower electrode layers 150GL, and the filling insulating layer 220. For example, the mask pattern 220M may be formed using silicon carbonitride ($SiC_xN_y$), silicon oxycarbonitride ($SiO_xC_yN_z$), or an SOH material. The mask pattern 210M may be formed to cover some portions of the top surface of each lower electrode layer 150GL and expose other portions of the top surface of each lower electrode layer 150GL.

Referring to FIG. 26, the portions of each lower electrode layer 150GL (see FIG. 25), which are not covered by the mask pattern 220M (see FIG. 25), may be removed using the mask pattern 220M as an etch mask to form four lower electrodes 150G at each support column 140G. The lower electrodes 150G may have an L-shaped or inverted L-shaped horizontal cross-section and may respectively surround the four corners of the support column 140G.

Thereafter, referring back to FIGS. 12 and 13, an insulating layer (not shown) may be formed on the insulating structure 120, the contact structures 130, the support columns 140G, and the lower electrodes 150G. An anisotropic etching process or a trimming process may be performed on the insulating layer to form the embedded spacer 142 filling a space between two adjacent lower electrodes 150G on a side wall of each support column 140G. The embedded spacer 142 may be formed by ALD or CVD using silicon oxide, silicon oxycarbide, or a low-k insulating material.

Thereafter, the dielectric layer 160 and the upper electrode 170 may be sequentially formed on the support columns 140G, the lower electrodes 150G, and a plurality of embedded spacers 142.

The integrated circuit device 100G may be completed by performing the processes described above.

According to the method described above, the island-type support columns 140G having a relatively large pitch (e.g., the second pitch P2 which is about the double of the first pitch P1) may be formed first, and the lower electrodes 150G may be formed on the side walls of each of the support columns 140G. Accordingly, difficulty of the forming process of the support columns 140G and the forming and etching process of the lower electrodes 150G may be decreased.

While inventive concepts has been particularly shown and described with reference to embodiments thereof, it will be understood that various changes in form and details may be made therein without departing from the spirit and scope of the following claims.

What is claimed is:

1. An integrated circuit device comprising:
   a substrate;
   a support pattern over the substrate,
      the support pattern including a first support structure extending in a vertical direction that is perpendicular to a top surface of the substrate;
   a lower electrode pattern and a dielectric structure over the substrate,
      the lower electrode pattern over the substrate between the support pattern and the dielectric structure,
      the lower electrode pattern including a first group of N lower electrodes that are spaced apart from each other,
      the first group of N lower electrodes extending in the vertical direction to a first level above the top surface of the substrate,
      N being an integer greater than or equal to 4,
      the dielectric structure including a first dielectric protrusion that surrounds the first support structure and the first group of N lower electrodes,
      the first dielectric protrusion extending in the vertical direction; and
   an upper electrode structure on the dielectric structure, the upper electrode structure including a first upper electrode protrusion that surrounds the first dielectric protrusion.

2. The integrated circuit device of claim 1, wherein a horizontal cross-section of the first support structure, taken at the first level, has a cross shape when viewed in a plan view.

3. The integrated circuit device of claim 2, wherein a first part of the first support structure extends in a first direction between two of the first group of N lower electrodes that are spaced apart from each other in a second direction that intersects the first direction, and a second part of the first support structure extends in the second direction between two of the first group of N lower electrodes that are spaced apart from each other in the first direction.

4. The integrated circuit device of claim 3, wherein an outer surface of the first part of the first support structure and an outer surface of the second part of the first support structure contacts an inner surface of the first dielectric protrusion.

5. The integrated circuit device of claim 3, wherein, the first part of the first support structure extends further in the first direction than the two of the first group of N lower electrodes that are spaced apart from each other in the second direction such that the first part of the first support structure protrudes in the first direction from the two of the first group of N lower electrodes that are spaced apart from each other in the second direction, and the second part of the first support structure extends further in the second direction than the two of the first group of N lower electrodes that are spaced apart from each other in the first direction such that the second part of the first support structure protrudes in the second direction from the two of the first group of N lower electrodes that are spaced apart from each other in the first direction.

6. The integrated circuit device of claim 3, the first part of the first support structure is coplanar in the first direction with the two of the first group of N lower electrodes that are spaced apart from each other in the second direction, and the second part of the first support structure is coplanar in the second direction with the two of the first group of N lower electrodes that are spaced apart from each other in the first direction.

7. The integrated circuit device of claim 2, wherein a horizontal cross section of the first group of N lower electrodes has a triangular shape, a quadrilateral shape, or a curved shape when viewed in a plan view at the first level.

8. The integrated circuit device of claim 1, wherein the support pattern includes a plurality of support structures that are spaced apart from each other and extend in the vertical direction,
   the lower electrode pattern includes a plurality of groups of N lower electrodes,
   the dielectric structure includes a plurality of dielectric protrusions that are spaced apart from each other and surround corresponding ones of the plurality of support structures,
   the N lower electrodes in each of the plurality of groups of N lower electrodes are arranged between an inner surface of one of the plurality of dielectric protrusions and an outer surface of one of the plurality of support structures that are adjacent to each other,
   the upper electrode includes a plurality of upper electrode protrusions that surround corresponding ones of the plurality of dielectric protrusions, and
   the plurality of support structures include the first support structure,
   the plurality of groups of N lower electrodes include the first group of N lower electrodes, and
   the plurality of dielectric protrusions include the first dielectric protrusion.

9. The integrated circuit device of claim 1, a horizontal cross-section of the first support structure taken at the first level has a rectangular shape or a square shape when viewed in a plan view, and the N electrodes in the first group of N lower electrodes are spaced apart from each other between along an outer surface of the first support structure and an inner surface of the first dielectric protrusion, and the N electrodes in the first group of N lower electrodes are separated from each other.

10. The integrated circuit device of claim 9, further comprising:
    embedded spacers that are spaced apart from each other between the outer surface of the first support structure and the inner surface of the first dielectric protrusion, wherein
    the embedded spacers separate the N electrodes in the first group of N electrodes from each other.

11. An integrated circuit device comprising:
    a substrate;
    a support pattern over the substrate,
       the support pattern including a first support structure extending in a vertical direction that is perpendicular to a top surface of the substrate,
       a horizontal cross-section of the support pattern having a cross-shape when viewed from a plan view;

a lower electrode pattern and a dielectric structure over the substrate, the lower electrode pattern over the substrate between the support pattern and the dielectric structure, the lower electrode pattern including a first group of lower electrodes that extend in the vertical direction to a first level above the substrate, the first group of lower electrodes including a first lower electrode, a second lower electrode, a third lower electrode, and a fourth lower electrode that are spaced apart from each other along an outer surface of the first support structure, the first lower electrode, the second lower electrode, the third lower electrode, and the fourth lower electrode being separated from each other by the first support structure, the dielectric structure including a first dielectric protrusion that surrounds the first support structure and the first group of lower electrodes, the first dielectric protrusion extending in the vertical direction; and an upper electrode structure over the dielectric structure, the upper electrode structure including a first upper electrode protrusion that surrounds the first dielectric protrusion.

12. The integrated circuit device of claim 11, wherein
the first support structure extends in the vertical direction to a second level above the substrate, and
the second level is further above the top surface of the substrate compared to the first level.

13. The integrated circuit device of claim 11, wherein
the first support structure directly contacts an inner surface of the first dielectric protrusion.

14. The integrated circuit device of claim 11, wherein
horizontal cross sections of the first lower electrode, the second lower electrode, the third lower electrode, and the fourth lower electrode have a triangular shape, a quadrilateral shape, or a curved shape when viewed in a plan view at the first level.

15. The integrated circuit device of claim 11, wherein
the first lower electrode, the second lower electrode, the third lower electrode, and the fourth lower electrode are between a concave surface of the first support structure and an inner surface of the first dielectric protrusion.

16. The integrated circuit device of claim 11, wherein
the first lower electrode and the second lower electrode are spaced apart from each other in a first direction,
the first lower electrode and the third lower electrode are spaced apart from each other in a second direction crossing the first direction,
the fourth lower electrode is spaced apart from the third lower electrode in the first direction,
the fourth lower electrode is spaced apart from the second lower electrode in the second direction.

17. The integrated circuit device of claim 11, wherein the first lower electrode, the second lower electrode, the third lower electrode, and the fourth lower electrode each contact a concave surface of the first support structure.

* * * * *